US010110333B2

(12) United States Patent
Jellison, Jr. et al.

(10) Patent No.: US 10,110,333 B2
(45) Date of Patent: Oct. 23, 2018

(54) VARYING MEDIA LOG RESTRICTIONS ON A PER-SUBSCRIBER BASIS

(71) Applicant: iHeartMedia Management Services, Inc., San Antonio, TX (US)

(72) Inventors: David C. Jellison, Jr., Ogallala, NE (US); Darren Grant Davis, Dallas, TX (US); Jeffrey Lee Littlejohn, Cincinnati, OH (US)

(73) Assignee: iHeartMedia Management Services, Inc., San Antonio, TX (US)

( * ) Notice: Subject to any disclaimer, the term of this patent is extended or adjusted under 35 U.S.C. 154(b) by 0 days.

(21) Appl. No.: 15/848,593

(22) Filed: Dec. 20, 2017

(65) Prior Publication Data

US 2018/0115377 A1 Apr. 26, 2018

Related U.S. Application Data

(63) Continuation of application No. 15/435,606, filed on Feb. 17, 2017, now Pat. No. 9,860,001, which is a continuation of application No. 13/478,476, filed on May 23, 2012, now Pat. No. 9,584,234.

(51) Int. Cl.
*H04H 40/09* (2008.01)
*H04H 20/06* (2008.01)
*H04H 60/06* (2008.01)

(52) U.S. Cl.
CPC ............ *H04H 40/09* (2013.01); *H04H 20/06* (2013.01); *H04H 60/06* (2013.01); *H05K 999/99* (2013.01)

(58) Field of Classification Search
CPC ........ H04H 20/38; H04H 60/06; H04H 40/09; H04H 20/06; H04H 60/80
USPC ..... 455/3.01–3.06, 414.1–414.4, 422.1, 403, 455/445, 410, 411, 566, 550.1, 500, 517, 455/426.1, 426.2, 502, 508, 512, 515, 455/509, 450; 725/62–72
See application file for complete search history.

(56) References Cited

U.S. PATENT DOCUMENTS

| | | | |
|---|---|---|---|
| 7,055,166 B1 | 5/2006 | Logan | |
| 2001/0003846 A1 | 6/2001 | Rowe | |
| 2011/0276396 A1 | 11/2011 | Rathod | |
| 2012/0020650 A1* | 1/2012 | Subramanian | H04N 21/4583 386/291 |

* cited by examiner

*Primary Examiner* — Keith Ferguson
(74) *Attorney, Agent, or Firm* — Garlick & Markison; Edward J. Marshall

(57) ABSTRACT

A subscription system includes a national subscription server capable of tracking which local stations subscribe to particular radio station music formats, for example AC middays, Top 40 afternoons, morning programs, or overnight Contemporary AC. A local music scheduler can query the subscription server for a log of nationally scheduled content to fill one or more dayparts of a local broadcast schedule. The subscription system can determine where to obtain the requested log, and provide the log to the local scheduler for insertion into a particular daypart of the local clock, while leaving the remaining dayparts free for local scheduling. Trusted subscribers can also be permitted to alter portions of log of nationally scheduled items. Inserting the log of nationally scheduled items into the local clock provides local awareness of both local and national media items scheduled for broadcast.

20 Claims, 18 Drawing Sheets

| | Pos/ | Airtime | Type | Description | Don't Copy | Runtime | Lock Level |
|---|---|---|---|---|---|---|---|
| | 1 | 00:00 | Link | LINERH | | 00:10 | Locked |
| | 2 | 00:10 | Song | P Primary | | 04:27 | Level 2 |
| | 3 | 04:37 | Song | P Primary | | 04:27 | Locked |
| | 4 | 09:04 | Voice Track | Voice Track Here | | 00:00 | Locked |
| | 5 | 09:04 | Spotset | Spot Block | | 00:00 | Locked |
| | 6 | 09:04 | Song | X-Parent Station Only | ✓ | 03:46 | Locked |
| | 7 | 12:50 | Song | P Primary | | 04:27 | Level 3 |
| | 8 | 17:17 | Voice Track | Voice Track Here | | 00:00 | Locked |
| | 9 | 17:17 | Spotset | Spot Block | | 00:00 | Locked |
| | 10 | 17:17 | Link | CLR Network Swee... | | 00:07 | Locked |
| | 11 | 17:24 | Song | X- Parent Station Only | ✓ | 03:46 | Locked |
| | 12 | 21:10 | Song | P Primary | | 04:27 | Locked |
| | 13 | 25:37 | Voice Track | Voice Track Here | | 00:00 | Locked |
| | 14 | 25:37 | Song | P Primary | | 04:27 | Locked |
| | 15 | 30:04 | Voice Track | Voice Track Here | | 00:00 | Locked |
| | 16 | 30:04 | Spotset | Spot Block | | 00:00 | Locked |
| | 17 | 30:04 | Link | CLR-Network Arti... | | 00:07 | Locked |
| | 18 | 30:11 | Song | P Primary | | 04:27 | Locked |
| | 19 | 34:38 | Song | P Primary | | 04:27 | Level 3 |
| | 20 | 39:05 | Song | S Secondary | | 04:24 | Level 2 |
| | 21 | 43:29 | Song | S Secondary | | 04:24 | Locked |
| | 22 | 47:53 | Song | P Primary | | 04:27 | Locked |
| | 23 | 52:20 | Song | F Extra | | 04:02 | Level 1 |
| | 24 | 56:22 | Song | F Extra | | 04:02 | Level 1 |
| > | 25 | 60:24 | Song | M Filler | | 04:10 | Locked |

FIG. 16

AC-Hot AC N2-Standard Night/WKN... Level 2

Assignments

| Date | Hour |
|---|---|
| 8/22/2011 | 1:00 AM |
| 8/23/2011 | 12:00 AM |
| 8/24/2011 | 1:00 AM |
| 8/25/2011 | 12:00 AM |
| 8/26/2011 | 1:00 AM |
| 8/27/2011 | 12:00 AM |
| 8/28/2011 | 1:00 AM |

VARYING MEDIA LOG RESTRICTIONS ON A PER-SUBSCRIBER BASIS

CROSS-REFERENCE TO RELATED APPLICATIONS

The present U.S. Utility patent application claims priority pursuant to 35 U.S.C. § 120 as a continuation of U.S. Utility application Ser. No. 15/435,606, entitled "SCHEDULE SUBSCRIPTION SYSTEM WITH VARIABLE RESTRICTIONS," filed Feb. 17, 2017, which is a continuation of U.S. Utility application Ser. No. 13/478,476, entitled "SCHEDULE SUBSCRIPTION SYSTEM," filed May 23, 2012, now issued as U.S. Pat. No. 9,584,234, all of which are hereby incorporated herein by reference in their entirety and made part of the present U.S. Utility patent application for all purposes.

TECHNICAL FIELD

This invention relates generally to media scheduling, and more particularly to automated scheduling of broadcast content.

DESCRIPTION OF RELATED ART

Music programming for a radio stations has traditionally been performed at the local level (the local radio station). Recent technology using internet connectivity has enabled the music programming to be provided by remote music services that may be available on a subscription basis to the local radio station. Radio stations are sometimes provided the option of obtaining a static schedule of songs from the remote music service, but the songs in the schedule obtained from the remote music source are kept separate from local programming due to difficulty in managing the rights to modify the logs, the Digital Millennium Copyright Act (DMCA) requirements for song play, and complexities in web-based services required to enable the right to make changes to a log.

Because the logs from remote music services are kept separate from the local programming logs, special care must be taken to prevent scheduling songs locally that conflict with songs scheduled by the remote music service. This problem is exacerbated because the music service may not provide information about which songs it has scheduled in a timely manner—the local programming system simply knows that a particular block of time has already been scheduled by the remote music service. It is apparent, therefore, that current techniques and systems used for scheduling radio broadcasts are less than perfect.

BRIEF DESCRIPTION OF THE SEVERAL VIEWS OF THE DRAWING(S)

Figure 5:
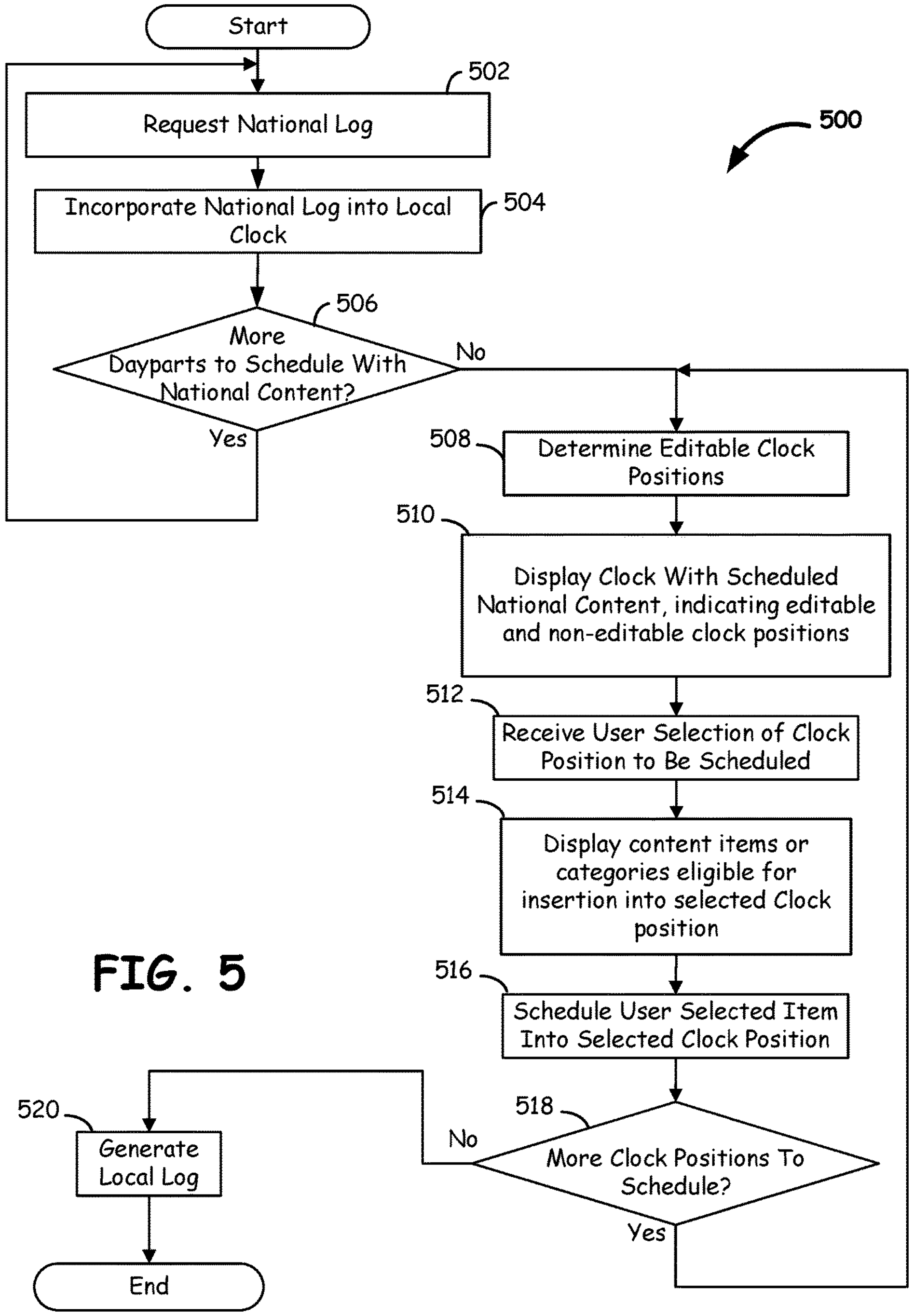
Figure 6:
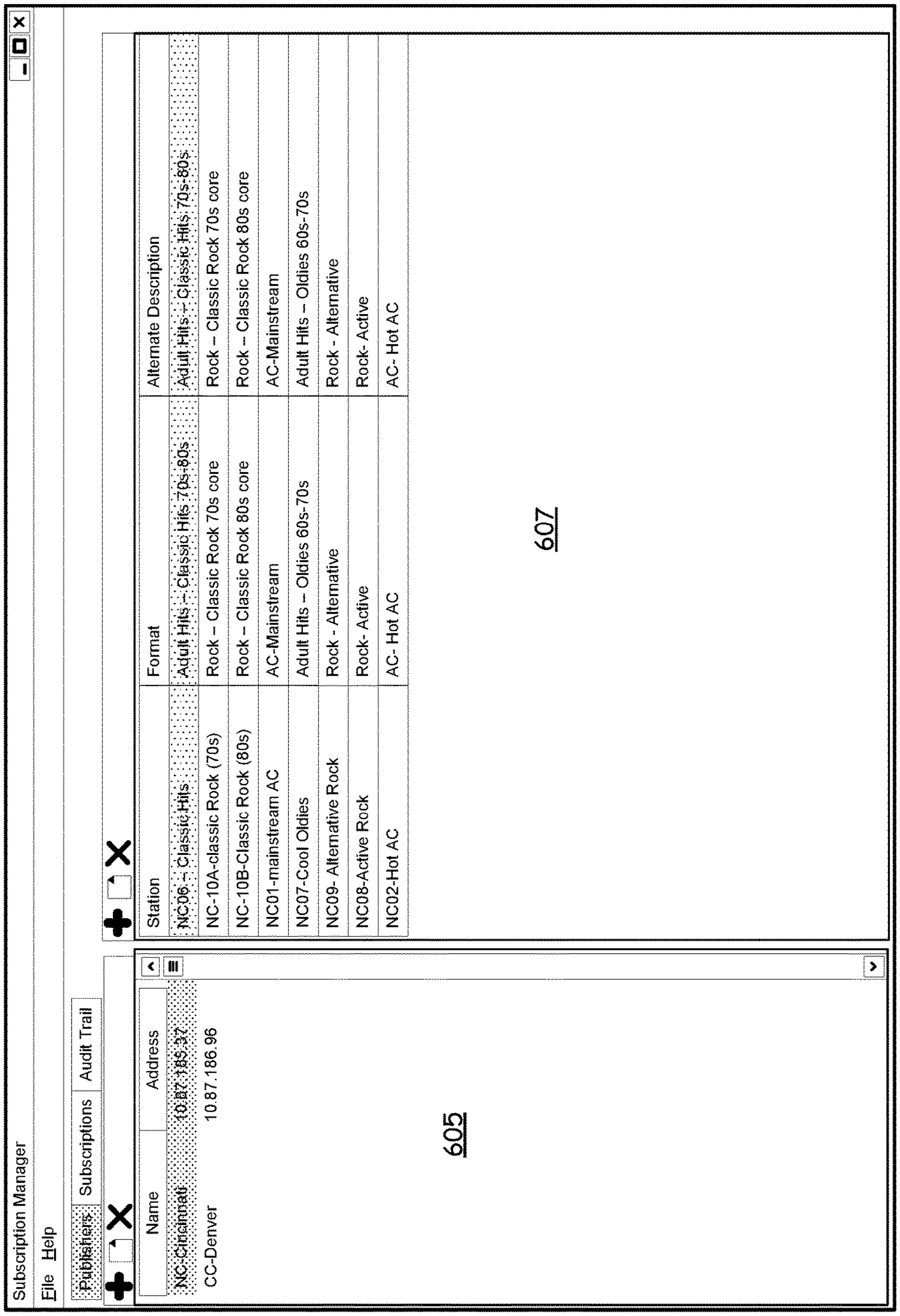
Figure 14:
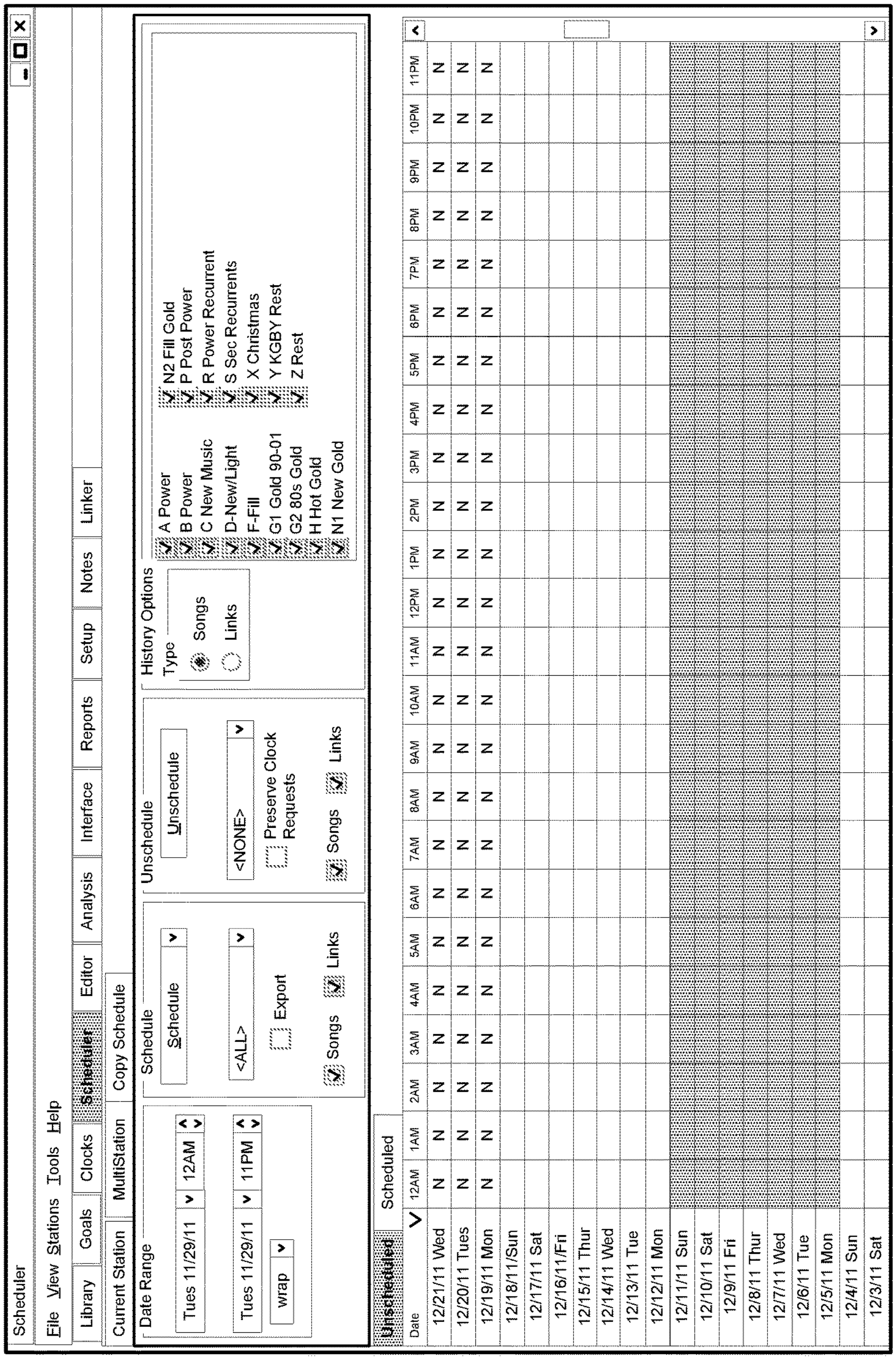
Figure 15:
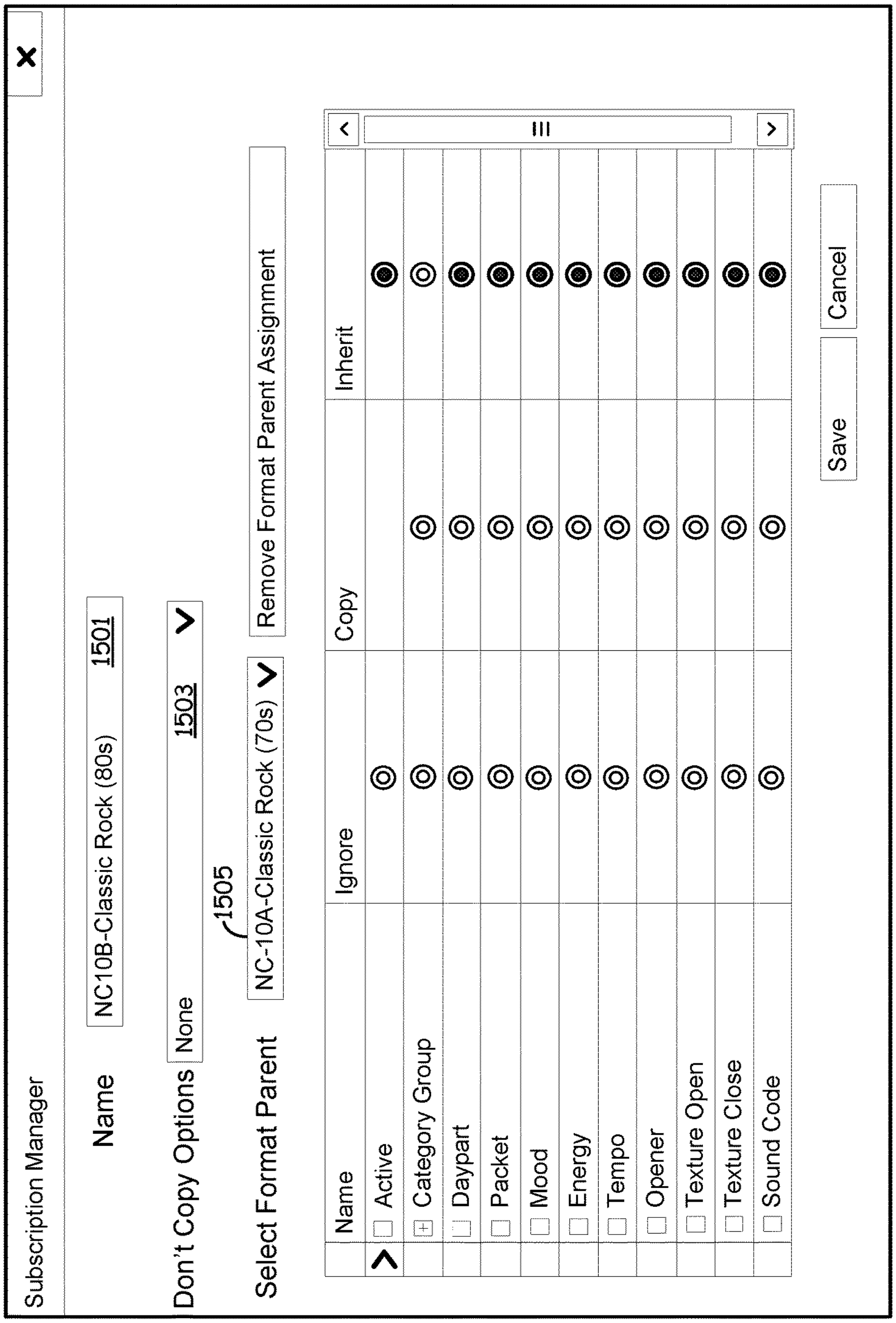
Figure 17:
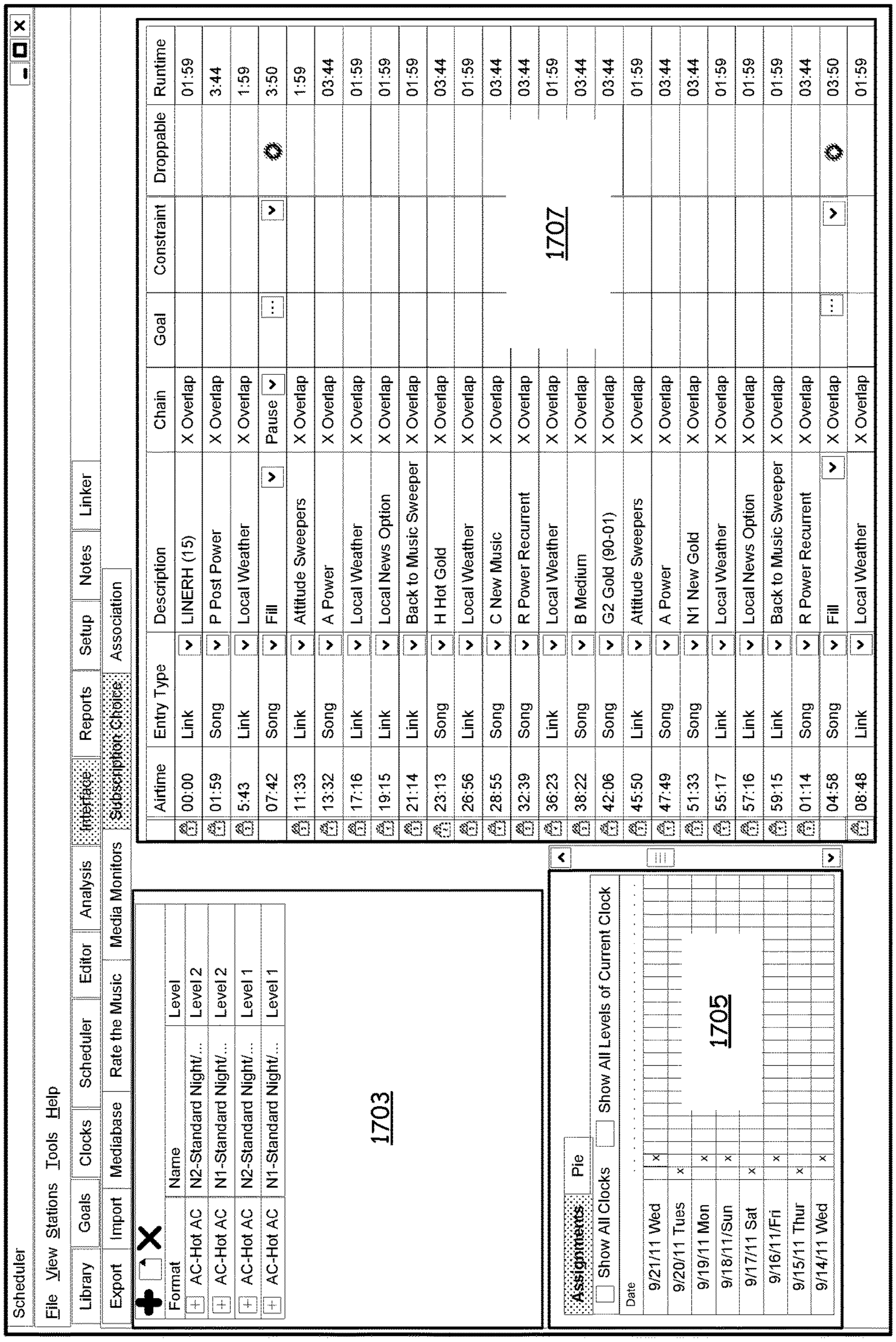
Figures 18, 19:
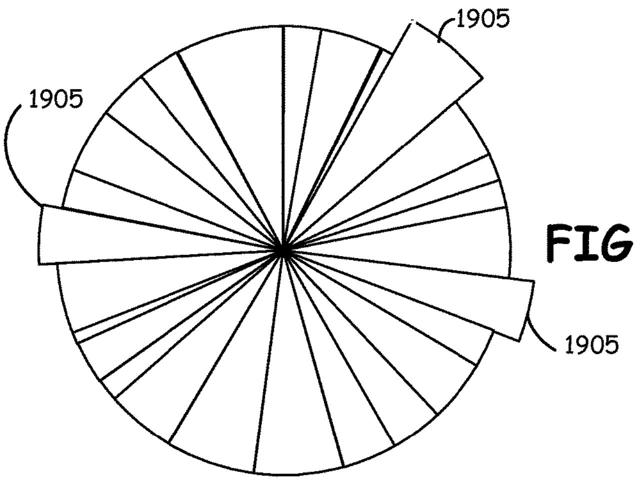
Figure 20:
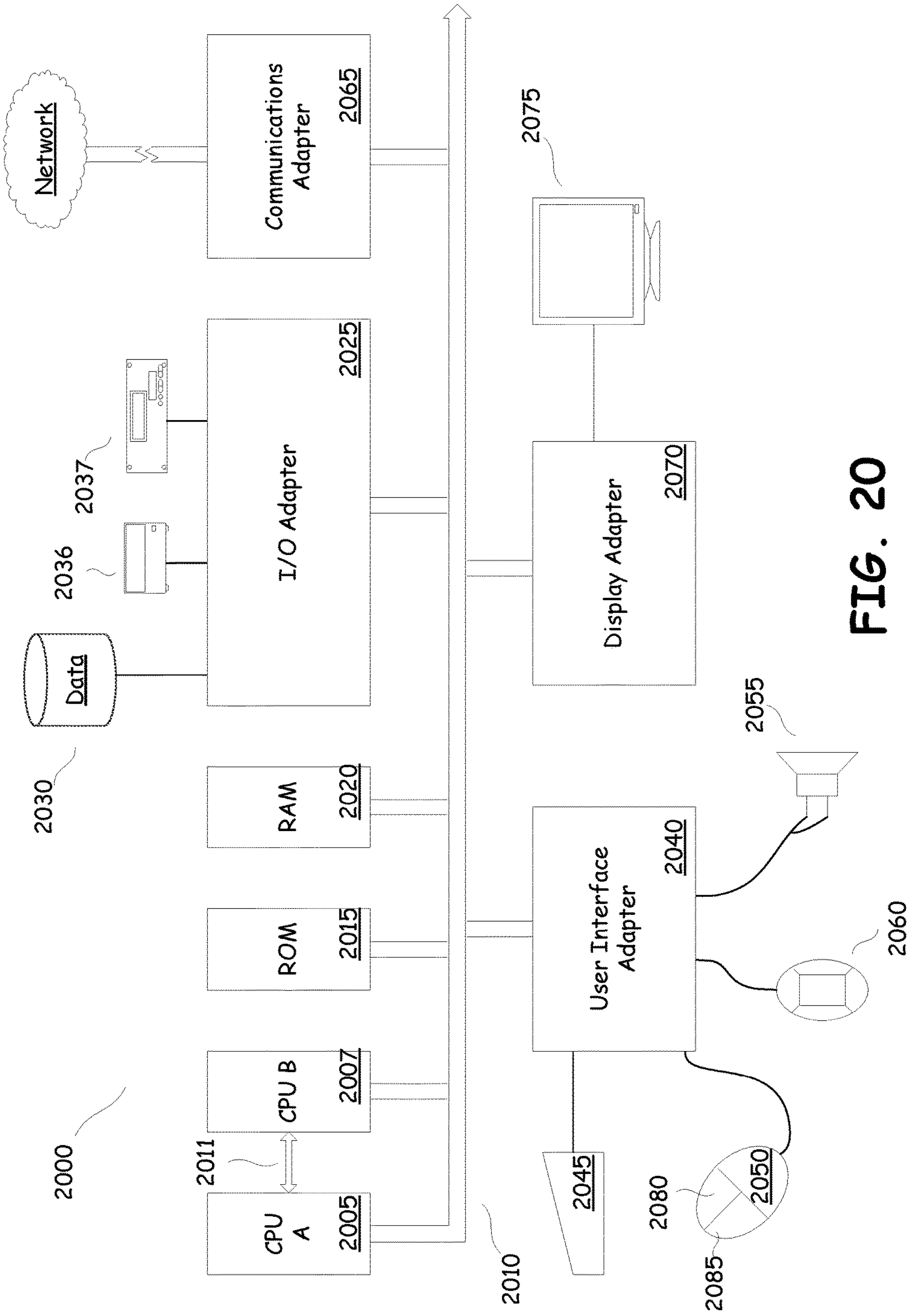

FIG. 5 a flow diagram illustrating a method of incorporating a national log into a local log, according to various embodiments of the present disclosure;

FIG. 6 is a diagram of a screen used by a schedule subscription system to display national logs obtained from various publishers, according to various embodiments of the present disclosure;

FIGS. 7-13 are diagrams of a subscription screen showing particular examples of its use in displaying information about national log subscriptions for individual local subscribers and stations according to various embodiments of the present disclosure;

FIG. 14 is a diagram of a scheduler window used in some embodiments to ensure that national logs are not downloaded to a subscriber before any necessary editing has taken place, and the logs have been approved;

FIG. 15 is a diagram of a lock options management screen, according to various embodiments of the present disclosure;

FIG. 16 is a diagram of a screen used to assign lock levels to the elements of a national log, according to various embodiments of the present disclosure;

FIG. 17 is a diagram of a scheduling window displaying local clock information, according to various embodiments of the present disclosure;

FIG. 18 is a diagram of an expanded list of dates, according to various embodiments of the present disclosure;

FIG. 19 is a pie chart illustrating editable and non-editable clock positions, according to various embodiments of the present disclosure; and FIG. 20 is a block diagram of a processing system, according to various embodiments of the present disclosure.

DETAILED DESCRIPTION OF THE INVENTION

Various systems and methods described herein include a subscription service that creates media logs in various genres, for example classic rock from the 1980's, or contemporary country. Generally, local media scheduling systems requests a log of media items to be included in its local programming. The subscription service provides the logs to various media scheduling systems, which incorporate the national log into a particular daypart of their local clocks, and generate local logs. The local log for each station is usually different from local logs of other stations, and even the daypart scheduled from the national log can differ from station to station depending on modification permissions for particular stations or subscribers.

The term "clock" as used herein refers generally to a template having positions associated with particular times of day, or in some cases simply timing relationships between the various slots. Each clock position is usually also associated with a particular type of content used to fill that position. For example, a clock for a rock radio station might have a 15 minute block of time that is intended to be filled with 2 classic rock songs and 1 alternative rock song. The clock may not originally specify exactly which classic rock or alternative rock songs are to be used. Each position in the clock can be filled with specific songs, advertisement spots, station identifiers, or other content that matches the requirements of particular positions in the clock "template." Once the clock is full, a log can be generated from the clock.

The term "log" refers to a relatively set schedule, which is often generated from a completed clock. The log may include specific content items and actual timing. Although a completed clock contains substantially all of the information included in a log, a clock is generally considered to be changeable, while a log is more fixed. That is to say, once the clock "template" is finalized, each of the positions of the clock is fixed by generating a log.

The media logs created by the subscription service are sometimes referred to herein as national logs, because the logs are often used by various different local radio stations throughout the nation. Unless explicitly stated, however, the term "national," when used in the context of media clocks, logs, and schedules, encompasses clocks, logs, and schedules generated by a media scheduling service that makes its media schedules available to multiple radio stations that are usually, although not necessarily, in different geographic markets.

National logs are consumed by local media scheduling systems, and inserted into local clocks to generate local logs. The local logs represent the broadcast schedule of a particular station. The term "local," when used in the context of stations, clocks, logs, and schedules, refers to clocks, logs, and schedules generated by a media scheduling system that performs media scheduling for a particular station by incorporating the national log, clock or schedule, into a schedule of media items to be broadcast or otherwise provided via a local station. A local station may include a station that broadcast to markets in multiple geographic regions, and in regions that are geographically distant from the local media scheduling system. Thus for example, an Internet radio station that broadcasts to all 50 states, as well as internationally, can still be considered a local station for purposes of this disclosure, if the station's schedule includes a daypart scheduled according to a national log, and other dayparts scheduled independently.

Figure 1:
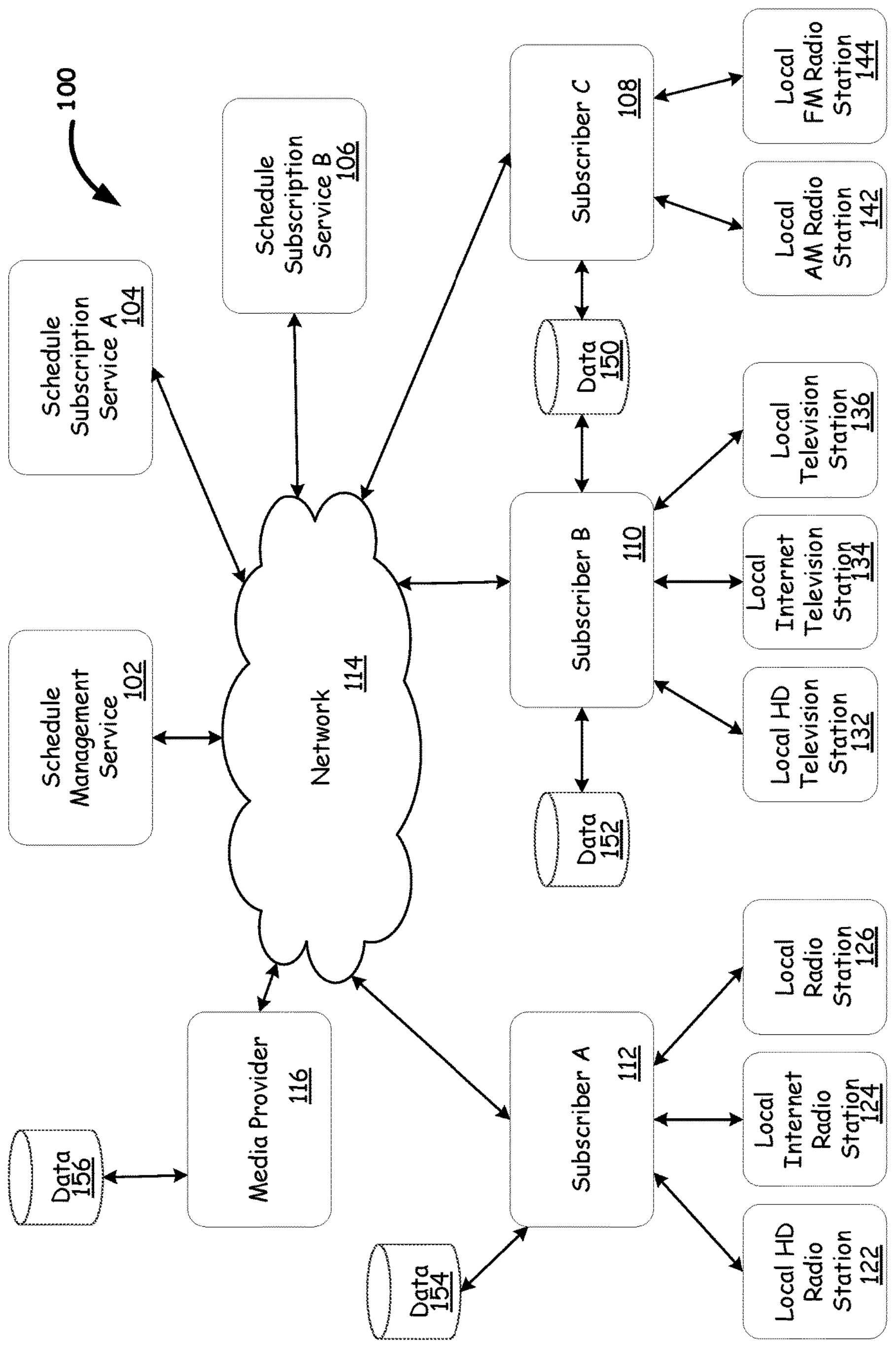
FIG. 1 is a block diagram of schedule subscription system, according to various embodiments of the present disclosure.

In some embodiments of a schedule subscription system, one or more schedule management services may provide national media logs to one or more subscribers. Referring first to FIG. 1, embodiments of a schedule subscription system 100 are illustrated and discussed. In some embodiments, schedule subscription system 100 may include schedule management service 102, schedule subscription service A 104, schedule subscription service B 106, media provider 116 and one or more subscribers 108, 110, and 112 coupled to each other for communication via network 114. Network 114 can include any of various types of wired or wireless communication networks including, but not limited to, wide area networks (WANs) such as the Internet; local area networks (LANs); wireless local area networks (WLANs); personal area networks such as Bluetooth and Wireless USB networks; and cellular and mobile telephone networks, which may further include a plain old switched telephone network (PSTN). Various different networks can also include, or be communicatively coupled to, AM, FM, satellite, and cable radio and television broadcasting facilities and networks, including those broadcasting in HD and non-HD formats. In some embodiments, schedule subscription service A 104 and schedule subscription service B 106 may provide national media logs to subscribers 108, 110 and 112. In some embodiments, the national media logs may include a variety of information, including information identifying scheduled broadcast times of specifically identified songs. In some embodiments, the national media logs may be generally formatted to cover particular dayparts.

In some embodiments, each subscriber may schedule any combination of national and local content when creating their media logs. For example, subscribers 108, 110, and 112 may generate media logs by inserting some or all of the information from the national logs obtained from one or more schedule subscription services 104, 106 into a local clock, and then modifying the local clock to include local content in addition to the national content obtained from schedule subscription services 104 and/or 106. For example, in some embodiments, subscriber C 108 may generate local logs for local AM radio station 142 and/or local FM radio station 144. In some embodiments, subscriber B 110 may generate local logs for local HD television station 132, local Internet television station 134, and/or local television station 136. In some embodiments, subscriber A 112 may generate local logs for broadcast via local HD radio station 122, local Internet radio station 124, and local radio station 126. The logs generated by any particular subscriber can be different for each of the stations associated with that subscriber, or the log can be common to each of the stations.

Generally a broadcast schedule may be generated by filling specific media items into positions of a local schedule, or clock. Each clock position may generally identify a start and end time of each clock position, which may be associated with the time-length of a media item that can be inserted into that particular clock position. A clock may generally include timeslots for media content, station identifiers and/or other voice tracks, and/or spot blocks that indicate where commercials are to be inserted. To fill in the clock, various embodiments employ a scheduling application, which provides a user interface to permit adjustment of clock positions, insertion of clock positions, insertion of media items into a particular clock positions, and/or replacement of media items into particular clock positions. The scheduling application can generate a log based on the completed clock. Ideally, the log will include specifically identified media items to be played in each clock position.

In some embodiments, clocks are generally broken into hour long segments that make up various different dayparts, for example morning drive, afternoon drive, midday, overnight, Saturday, and Sunday. In other embodiments, clocks may be broken into half-hour segments, quarter-hour segments, or may be adjusted to some other smaller or larger segment. In some cases, the term daypart is intended to encompass units of time that include one or more hours, although smaller time units can still be considered to be within the meaning of the term daypart. In some cases a local station will desire to use a national schedule to fill one or more dayparts in its local schedule. Consider the following example involving subscriber A 112. Subscriber A 112 may desire to fill the afternoon drive on Mondays for local HD radio station 122 using contemporary country music. Subscriber A 112 may desire to fill the same daypart for local radio station 126 with classic rock songs. To accomplish this, subscriber A 112 can purchase subscriptions to broadcast contemporary country music during the Monday afternoon drive on local HD radio station 122, and purchase a subscription to broadcast classic rock on local radio station 126 during the same timeframe. Subscriber A 112 can purchase the subscriptions from either schedule subscription service A 104 or schedule subscription service B 106, as desired and available.

When subscriber A 112 is ready to generate a log for its local radio stations, a scheduling system used by subscriber A 112 can generate a request to be sent to schedule subscription services 104 and/or 106 via network 114. In response, schedule subscription services 104 and/or 106 can send the requested logs to the scheduling system used by subscriber A 112, which populates the afternoon drive daypart of the clocks used for local HD radio station 122 and local radio station 126 with specifically identified content items. Populating the afternoon drive daypart of the local clocks using specifically identified items from a national log can provide superior scheduling control, as compared to techniques in which clock position scheduled according to a subscription are simply marked as scheduled, without any indication of the particular item to be inserted into each particular clock position.

In some embodiments, schedule subscription system 100 may provide varying levels of access, or access controls, for subscribers. For example, one or more of the clock positions in the afternoon drive schedule for local HD radio station 122 and local radio station 126 can be locked from editing, or have editing allowed, based on a subscription level, a trust level, digital rights management (DRM) considerations, licensing factors, user preferences, or other factors. In some embodiments, clock positions for which editing is permitted, may be limited to edits that include items selected from a particular database, genre, subscription category, or other pool of permissible content items. In some instances the other pool of permissible content items may include a list of other media items supplied by a schedule subscription service, or local items selected according to various criteria related to mood, energy, tempo, sound code, category, or texture, which refers to the way melodic, rhythmic, and harmonic materials are combined.

Using the national log obtained from a schedule subscription service to fill a daypart of a local clock leaves the remaining dayparts available to be filled with locally selected content items. Note that in this instance, content items are distinguished from commercials, also referred to as spots, which in many cases are not provided by schedule subscription services in their national logs, and corresponding spot blocks in a clock corresponding to the national log are usually left to be filled locally. Filling dayparts of the local clock not filled by a national log from schedule subscription service A 104 and/or schedule subscription service B 106, can be accomplished automatically using information stored in data storage 150, 152, 154, or 156, manually, or using a combination of automated and manual techniques.

The actual media items broadcast via the local stations can be obtained by subscribers, or directly by the local radio stations themselves. In some cases, subscribers 108, 110, and/or 112 can obtain media items from associated databases 150, 152, and/or 154, or from a third-party media provider 116 and its associated datastore 156. In some embodiments, subscribers 108, 110, and 112 may use a schedule management service 102 to provide local station scheduling services. Schedule management service 102 can be used in place of, or in addition to, a local scheduling system to generate local clocks, local logs, and to perform other scheduling services.

In some instances, subscriber A 112, subscriber B 110, or subscriber C 108 can contact schedule management service 102 to determine which schedule subscription service, schedule subscription service B 106 or schedule subscription service A 104, has a desired schedule available. For example, schedule subscription service A 104 may have a Wednesday morning drive log available, but may not have a desired Wednesday midday log. In that case, schedule management service 102 can provide a subscriber with the information necessary to obtain the desired subscription. The information can include but is not limited to Internet links, addresses, email addresses or other contact information, subscription information, performance information, and pricing information. In some embodiments, subscribers may communicate directly with, or be directly linked to, one or more schedule subscription services.

Regardless of whether a subscriber obtains a national log from a schedule subscription service directly, or via schedule management service 102, various embodiments allow a subscriber to insert, into its local clock, information from multiple different national logs obtained from different schedules subscription services, or other sources. Thus, subscriber C 108 can essentially fill a local clock for local FM radio station 144 with multiple different national logs, some of which are obtained from schedule subscription service A 104, and some of which are obtained from schedule subscription service B 106. In some embodiments, one or more subscribers can fill a local clock with multiple different logs obtained from one or more other subscribers. For example, subscriber B 110 may share log information directly with subscriber C 108, via database 150, so that each subscriber can fill their local clocks with content from the other subscriber.

Conditions for using a particular log may include restrictions associated with using logs from other providers, or even logs from the same provider but different genres, groups, or types. In this way, schedule subscription service can more readily ensure that there is no conflict between songs or other media items included in adjacent dayparts in a single local log. In some instances, these restrictions can be enforced more easily through use of a schedule management service 102, but use of a particular schedule management service is not required.

In some instances, use of a particular schedule management application is not required, while in other embodiments national logs may be provided only to subscribers using scheduling software and systems that meet certain security requirements, and are capable of enforcing various locking mechanisms that can be used to prevent unauthorized changes to national logs provided by schedule subscription services 104 and/or 106. In some instances logs can be provided to a scheduling system only after the scheduling system passes authentication checks. Note, that although subscriptions are discussed in conjunction with obtaining national logs, in some instances providers of national logs do not require subscriptions, and national logs can be distributed to one or more subscribers based on registration information, information included in a request for a log, or the like.

Figure 2:
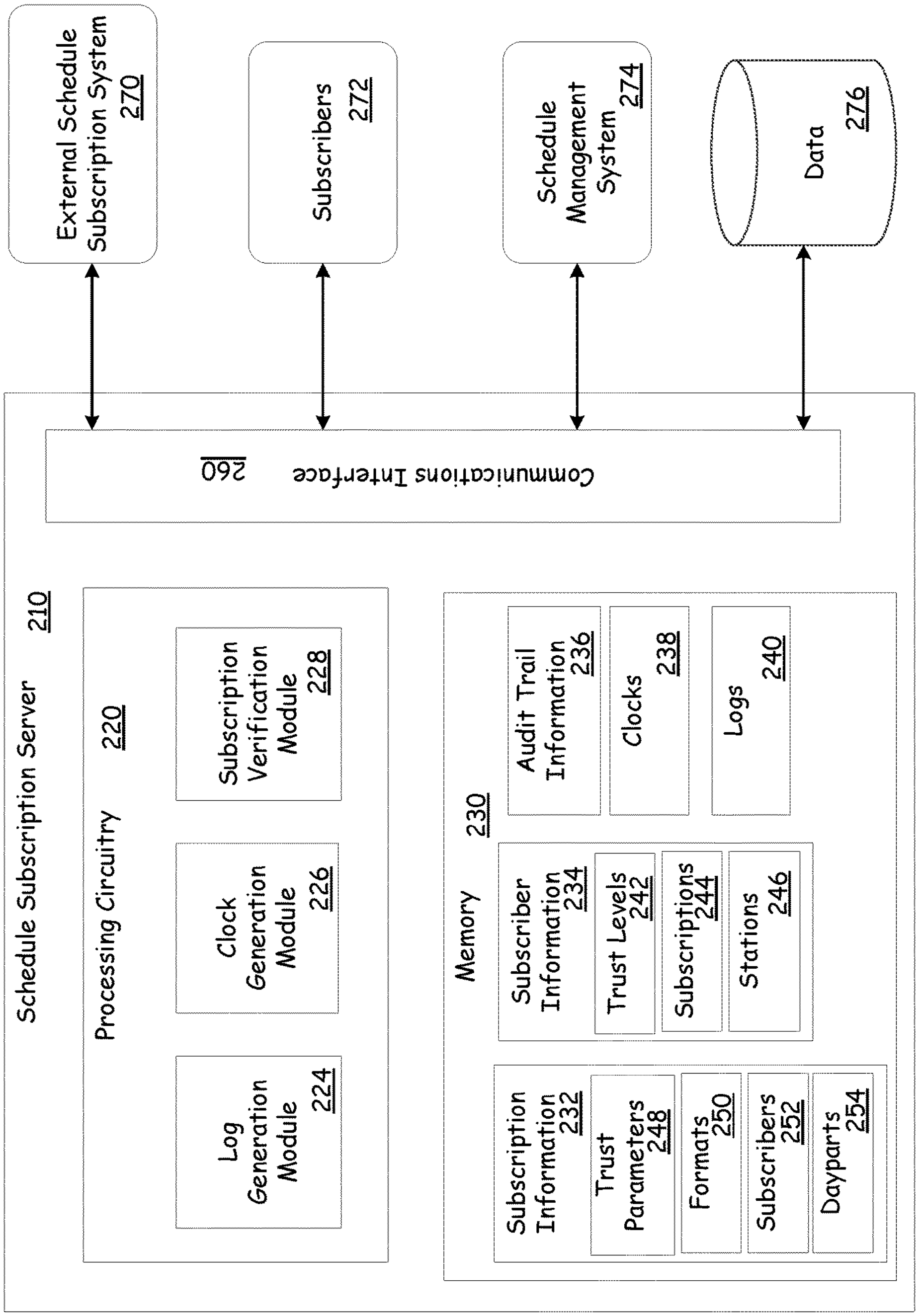
FIG. 2 is a block diagram of schedule subscription server, according to various embodiments of the present disclosure.

Referring next to FIG. 2, a schedule subscription server 210 is illustrated according to various embodiments of the present disclosure. In some embodiments, a schedule subscription server 210 may be included in, or attached to, schedule subscription service B 106 and/or schedule subscription service C 108 in FIG. 1. Schedule subscription server 210 may include processing circuitry 220, memory 230, and communications interface 260. Processing circuitry 220 may include log generation module 224, clock generation module 226, and subscription verification module 228. Memory 230 can be used to store: subscription information 232, which may include trust parameters 248, formats 250, subscribers 252, and/or dayparts 254; subscriber information 234, which may include trust levels 242, subscriptions 244, and/or stations 246; audit trail information 236; clocks 238; and/or logs 240. Communications interface 260 can be configured to communicate, via a communications network (not shown in FIG. 2), with external schedule management system 274, subscribers 272, schedule management system 274, and data store 276. In some embodiments, the communications network may be similar to network 114 described in FIG. 1.

Log generation module 224 can be used to generate national logs to be provided to an external schedule subscription system 270 and subscribers 272. Clock generation module 226 can be used to generate national clocks, which may serve as the basis for the logs generated by log generation module 224. Both logs and clocks can be generated in advance, and stored in memory 230 to be provided to subscribers 272 upon request, or on a recurring basis. In some embodiments, clock generation module 226 and log generation module 224 generate logs in response to receiving a request from either a subscriber 272, or a schedule management system 274. In some instances, the clock generation module 226 and log generation module 224 operate on an iterative basis, so that clock generation module 226 generates an initial national clock, and as the positions in clock generation module 226 are filled with specific content items by log generation module 224, clock generation module 226 can adjust the length of one or more clock positions based on actual items selected for inclusion by log generation module 224.

Subscription verification module 228 can be used to verify that a subscriber 272 requesting a particular log, or a particular scheduling application or scheduling device used by subscriber 272, is authorized to receive the requested log. In some instances, subscription verification module 228 can also be used to verify the security parameters associated with scheduling device meet at least a minimum hardware and/or software security requirement.

Log generation module 224 and clock generation module 226 may individually, or in cooperation with each other, lock particular content items included in a national log, or particular clock positions. Whether or not a lock is to be set for particular content items or clock positions, can be determined by log generation module 224 and clock generation module 226 based on the subscription information 232 and subscriber information 234. For example, subscription information 232 may include trust parameters 248 that are required before any subscriber to a particular type of subscription, for example morning drivetime logs in the Alternative Rock format, is allowed to perform any editing whatsoever. Thus, in this example trust parameters 248 may indicate that a subscriber with a trust level of two or better can make changes to specified media items or clock positions. This type of editing lock can be determined in advance of any particular request, and can be stored in clocks 238 in conjunction with a clock generated by clock module 226, or in logs 240 in conjunction with a log generated by log generation module 224.

Information about formats associated with a particular subscription can be stored in formats 250, and information about dayparts associated with a particular subscription can be stored in dayparts 254. This format information can be used by log generation module 224 and clock generation module 226 to determine whether a particular content item is suitable for inclusion in a national log or clock. Consider a subscription to an easy listening format log to be played during an overnight weekend daypart. The subscription information associated with this log can include a format identifier stored in formats 250, which can indicate that the subscription is for an easy listening format; and a daypart identifier stored in dayparts 254, which can indicate that the subscription was for use in a weekday overnight daypart.

In some embodiments a particular subscription may be valid for more than one format or valid for more than one daypart. In that case, formats 250 could indicate that the particular subscription could be provided, for example, in response to easy listening requests for a Monday, Wednesday, or Thursday overnight daypart, and for any time on Sunday, while the same subscription could also be provided in response to a request for an "oldies" format on Tuesdays or Fridays for the midday daypart. The identity of each subscriber subscribing to a particular subscription can also be stored in subscribers 252, so that a subscriber can be notified when any changes made to a particular log are made.

Subscriber information 234 can include trust levels 242 associated with each subscription held by a particular subscriber, a listing of subscriptions 244 associated with a subscriber, and station information identifying which broadcast stations are associated with a particular subscriber. Subscriber information 234 can be used by the subscription verification module 228 to authenticate a subscriber 272 and determine whether the subscriber 272 has a valid subscription for the requested log. Log generation module 224, clock generation module 226, and subscription verification module 228 can also use the subscriber information 234 and the subscription information 232 to determine whether one or more clock positions or log items are editable by the subscriber. In some embodiments, the subscriber may be permitted to edit a log for one station, but not edit the very same log for use in a different station. Using station information 246 can assist processing circuitry 220 in making the locked/editable decision.

A particular log can be locked completely from editing, or different levels of locking can be applied. For example, a trust level one lock authorization, which in at least one embodiment allows maximum editing, may allow a subscriber to edit three different clock positions, and to replace content in any of those three clock positions with content selected from a database of content items have a maximum selection. In the same example, a level four trust level lock authorization may indicate that no editing can be performed. An intermediate trust level lock authorization may indicate that fewer positions can be edited, that fewer choices for replacement content are available, or both. Various lock levels can also be used to restrict or allow addition of extra clock positions, and movement of clock positions.

Setting lock levels on content and clock positions can be performed each time a request is received, or based on pre-stored locking criteria. Regardless of when lock levels are set, they can be determined, for example, on a subscriber basis, on a station basis, on a subscriber/station basis, on a volume basis, on a timing basis, on a subscription basis, or on a content basis. In some instances, stored lock levels can be overridden based on subscriber information 234, subscription information 232, audit trail information 236, or in some cases manually. Subscription information can also include information regarding when a particular subscription is scheduled to start or end, thus allowing temporary access to logs, and temporary override of a trust level or an associated lock level.

Figure 3:
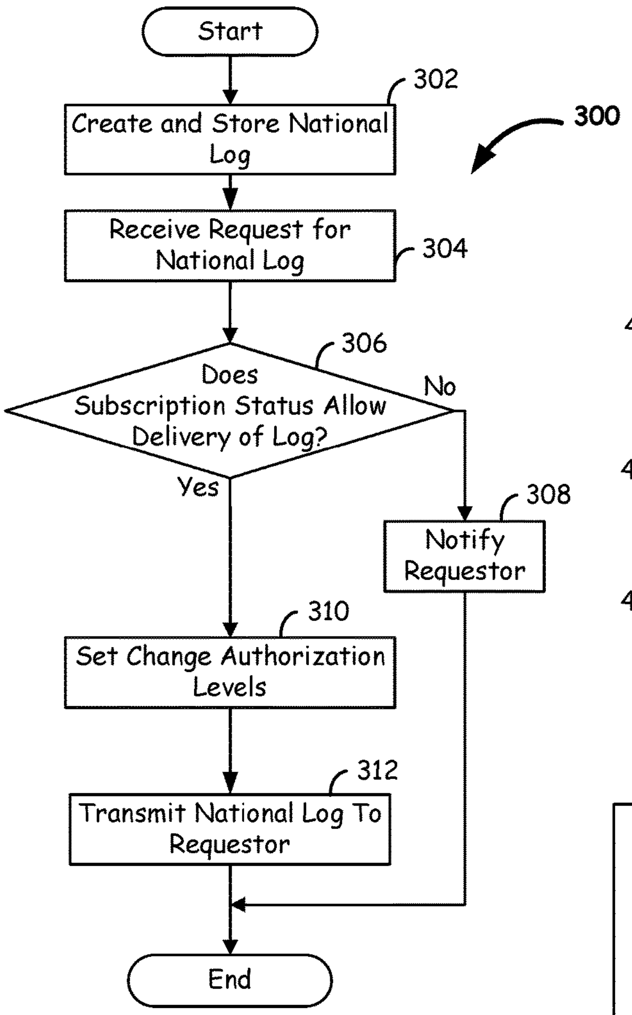
FIG. 3 is a flow diagram illustrating a method of providing national logs, according to various embodiments of the present disclosure.

Referring next to FIG. 3, a method 300 is illustrated and discussed according to various embodiments of the disclosure. As illustrated by block 302 a schedule subscription service generates and stores media logs. Some media logs can be specifically designed for particular local markets, subscribers, or stations, while others are less specifically tailored, and are more generally created for use in widely disparate situations. In some instances, national media logs are created in a variety of formats, and each log can be used in any daypart, by any authorized local station requesting one of the logs. Some national logs can be restricted for use in specified hours, days or dayparts, or restricted to use by subscribers having a specified minimum trust level. Some national logs can have partial restrictions on use for one subscriber, market, or station, but be unrestricted for others.

The restrictions can be stored in conjunction with the national logs, or determined upon receipt of a request for a national log. In at least some embodiments, the restrictions can be delivery restrictions, use restrictions, or editing restrictions. Time restrictions can also be placed on the national logs in place of or in addition to other types of restrictions. For example, a time restriction may prevent a log from being delivered except within a specific time window, or prevent a national log from being delivered after or before a time threshold. Time restrictions can also be used to restrict use or editing rights. So, for example, even if a national log is delivered to a local scheduling system, use or editing of the log can be prevented after or before a specified time. In some instances, time restrictions can allow the log to be entered in a local clock for viewing, but generation of local log will not occur, or will not include the content included in the national log, until the time restriction is satisfied. Time restrictions can also be relative, so that generation of a local clock including the national content can be inhibited if another log has been generated using the same national log within a threshold period of time. Various different restrictions can be combined to achieve desired results.

As illustrated at block 304, a request for a national log can be received at a scheduling subscription service. The request can be generated by a local scheduling application running on a local scheduling server. The request can include a request for a single national log for a single station, a request for multiple national logs for a single station, a request for multiple national logs for multiple different stations, or some combination thereof. The request may also include a request to generate a national log if a desired national log has not been previously generated. In some embodiments, the request can be an update request, asking a scheduling subscription service to update a previously delivered national log.

In some instances the request can also include an edit request. An edit request can be used to request a change to the log by a local scheduling system without authority to edit a particular log or clock position in the log. In some instances the edit request can take the form of an error notification from a local scheduling system that alerts the scheduling subscription service of an error in the national log. The error can be, for example, an error in identification of a particular media item, a misscheduled media item, or a misapplied edit lock.

As illustrated by block 306, a check can be made to determine whether the subscription status associated with the request allows delivery of the national log, as requested. Determining the subscription status can include, but is not limited to, verifying that a particular subscriber/station combination is authorized to receive the national log. In some cases, authorization to receive the log can be determined based on a subscription status associated with the requestor, a trust level associated with the requestor, a trust or security level associated with the local scheduling system or software that will be using the national log, a trust level associated with one or more stations, a subscription expiration date, or a subscription start date.

If it is determined at block 306 that delivery of the log is not allowed, a notification can be sent to the requestor, as illustrated by block 308. The notification can include various information including information about necessary corrective actions to change the subscription status so that access to the log will be allowed, an explanation of what national logs are available according to the requestor's subscription, and indication of actions that can be taken to increase the trust level of the requesting scheduling system, or other similar corrective actions.

As illustrated by block 310, if delivery of the requested log is permitted, the change or edit authorization levels can be determined and set. In some embodiments, the change authorization levels can be determined by reading predetermined change authorization levels from memory, and in others the change authorization levels can be determined and set by processing various subscriber and subscription information during the process of providing the requested log. In some instances, the change authorization levels can be set and stored prior to receiving the request. For example, if the request is a recurring request, the change authorization levels may be set during servicing of an initial request, and then re-used during subsequent requests. In some embodiments, the change authorization levels can be set upon generation of the log, and overridden as necessary during processing of a log request. As illustrated by block 312, after the change authorization levels are set, the national log can be transmitted to the requestor.

Figure 4:
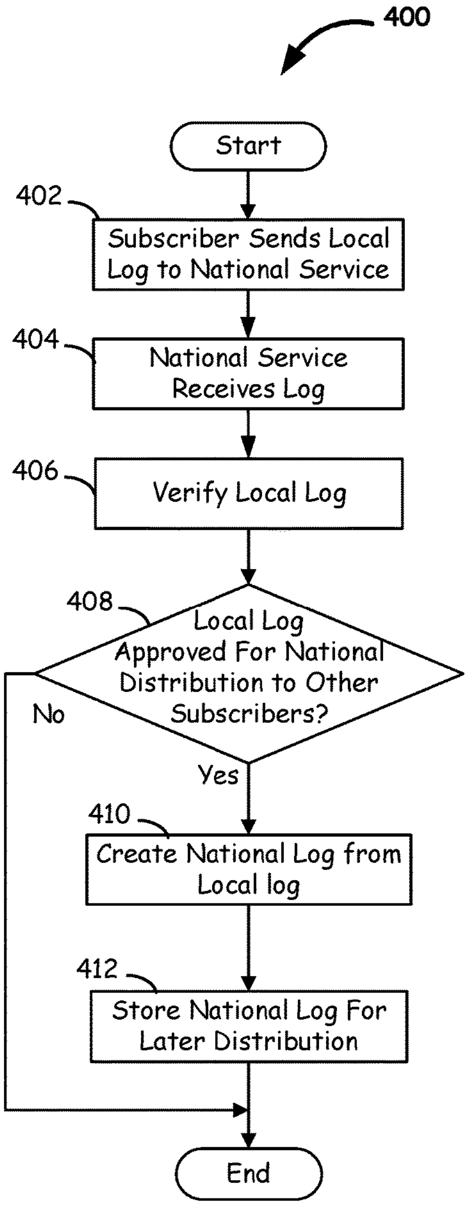
FIG. 4 is a flow diagram illustrating a method of creating a national log from a local log, according to various embodiments of the present disclosure.

Referring next to FIG. 4, a method 400, in which a local log is uploaded and then distributed as a national log, is discussed according to various embodiments. As illustrated at block 402, a subscriber sends a locally generated log to a national scheduling service. The log can be generated by a scheduling application used to generate broadcast logs for one or more local stations. The locally generated log can include local content, or a combination of local content and national content originally obtained from the national scheduling service. Thus, in some instances, a local scheduling system can request and receive a national log for a daypart, make allowed edits to that daypart, and send the altered log back to the national scheduling service. In other embodiments, the local log includes all locally scheduled content. As shown by blocks 404 and 406, the national scheduling service receives and verifies the local log. Verification of the log can include checking for internal inconsistencies, checking for compliance with DRM requirements, timing, proper formatting, and other schedule generation parameters.

As illustrated at block 408, a decision can be made about whether to approve the local log for national distribution. The decision can include evaluating anticipated appeal to a wide variety of audiences, suitability for particular formats, suitability for broadcast during particular dayparts, a trust level of the subscriber transmitting the log, a subscription status of the subscriber, evaluation of performance metrics associated with prior use of the local log on local stations or test stations, success of logs previously submitted by the subscriber, differences and similarities between the submitted log and other national logs already generated or submitted by other subscribers, costs of obtaining scheduled media items, or compliance with schedule generation best practices.

If the log is not approved at block 408, method 400 ends. As illustrated by block 410, however, if the log is approved for national distribution at block 408, a national log can be generated from the local log. In some instances, this can include generation of a national clock including the clock positions to be filled by items listed in the formerly local log. In many cases, generating the national log includes setting appropriate daypart, format, trust levels, and subscription parameters, and setting distribution, editing, and use restrictions, in a manner similar to that used for national logs originating from the national scheduling service. In some embodiments, a nation log that is created from a local log may allow all clock positions to be edited, even subscribers or stations having a minimal trust level with respect to other national logs. Some such logs can be provided as-is, and may even be provided to non-subscribers for use during less desirable dayparts as part of a promotional effort.

As illustrated at block 412, the newly generated national log is stored for later distribution, along with appropriate parameters, lock levels, and other information. Access to the national logs generated according to method 400 can be later provided in a manner similar to the manner in which access is provided to national logs originating with the national scheduling service.

Referring next to FIG. 5, a method 500 is illustrated and discussed according to various embodiments. As illustrated at block 502, a local scheduling system can transmit, to a schedule subscription service, a request for a national log for use in scheduling any portion of a broadcast, including for example, a desired daypart for a local broadcast. The request can include information identifying a requestor, a requesting system, a subscription identifier, a desired format, a desired daypart, a password, or the like. In some instances, the request can be sent to a third party, such as a schedule management service, which acts as a proxy for the local scheduling system.

As also illustrated by block 502, the schedule subscription system, can respond to the request by providing the requested log to the local scheduling system, or to the schedule management service acting on behalf of the local scheduling system. In some embodiments, the local scheduling system can obtain the national log without first sending a request, for example when national logs are pushed to the local scheduling service on a recurring or one-time basis. In some embodiments, national logs are automatically downloaded into a local scheduling system periodically, or under the following conditions: when the local scheduling system is attempting to schedule a date having at least one completely unscheduled hour; when the local scheduling system enters an editing screen on a date having at least one completely unscheduled hour; when integrating traffic on a date having at least one completely unscheduled hour; or when a local scheduling system imports a schedule into a date having at least one completely unscheduled hour.

As illustrated at block 504, once the national log has been obtained, the national log can be incorporated into the corresponding clock positions of a local clock used to generate a local broadcast log. In some embodiments, including but not limited to embodiments in which the national logs are periodically pushed to the local scheduling system, rather than requested, a decision (not illustrated) can be made to determine whether or not the national log is to be incorporated into one or more local logs. The national log can be automatically incorporated into the local clock by the scheduling system, and can include information about a media item from the national log inserted into each local clock position.

As illustrated by block 506, method 500 can continue to obtain and incorporate national logs into various dayparts of the local clock, until there are not more national logs to be used in the local schedule. As shown by block 508, once all of the national logs to be used have been obtained and incorporated into the local clock, a check can be made to determine editable clock positions. Information about which clock positions in national-log dayparts are editable, if any, can be included in the national logs themselves. A determination of editable clock positions can also be made each time a clock position is selected for editing, or periodically by requesting separate edit lock instructions from a source of the national log.

As illustrated by block 510, the local scheduling system can display all or a portion of a local clock that shows each clock position filled by national log, including an identifier of the media item used to fill each position. In addition to displaying the media item included in each clock position, the local scheduling system can also display indicators that denote which clock positions are editable, if any, and which clock positions can be changed. In some embodiments, an indication of a trust level can also be displayed. The trust level can be associated with the subscriber, local scheduling system, station, national log, or any combination of these. In various embodiments, the entire local clock can be displayed, including empty clock positions and dayparts that have not yet been filled using the national logs. In other embodiments, only the dayparts corresponding to the national logs are displayed, while in others particular dayparts and immediately preceding and subsequent unfilled clock positions are displayed.

As illustrated by block 512, a user may desire to edit one or more of the clock positions filled by the national log, and select the clock position for editing. In some instances, editing of the selected clock position may be completely locked for a particular subscriber/station combination, subscriber, local scheduling system, or log. In others, the lock may be partial, allowing insertion of only approved media items in particular clock positions. In some such instances, a drop down menu of approved replacement items can be displayed, and the local scheduling system can receive user input indicating which of the approved items is to be used.

In some embodiments, upon receiving the user input indicating selection of a particular clock position for editing, the scheduling system can obtain information from the national log indicating a data source of approved replacement content, and either automatically select a most highly rated replacement item, or obtain a list of replacement items from the indicated source and display the items to the user for selection.

In cases where adjacent clock positions permit, or where a clock position is located adjacent to a locally scheduled position, authorized subscribers can be allowed to change the time allotted to one or more clock positions, which can permit selection of media items having different lengths than the length of the originally scheduled media item. For example, if two adjacent, editable clock positions are 1.5 minutes each, rather than being required to choose replacement items from a list including only 1.5 minute long media items, one media item having a length of 1.2 minutes and another media item having a length of 1.8 minutes can be selected. For editable media items at the beginning or end of a daypart, the position in the local clock immediately before or after the editable clock position can be adjusted to account for the difference between a replacement item having a different length than the item in the national log.

When replacement categories, rather than specific replacement items are displayed, as illustrated by block 514, the categories of eligible replacement items can be based on format, status as a premium item, subscription level, trust level, market, station, or combinations of these. For example, a highly trusted subscriber may be allowed to select from a larger number of categories than a less trusted subscriber, but both more trusted and less trusted, subscribers may be limited to selecting replacement items from a limited number of formats, selecting items with particular tempos, and prohibited from selecting premium items absent a required subscription level.

As illustrated by block 516, user selected replacement items, or local content items to be placed into unscheduled clock positions, are inserted into the clock. Once it has been determined, as illustrated by block 518, that there are not more clock positions to be scheduled, a local log can be generated from the local clock at block 520.

Referring next to FIGS. 6-19, various screens displayed by a schedule subscription system will be discussed according to various embodiments of the present disclosure. In some embodiments, the screens may be displayed inside a web browser, such as internet explorer, Mozilla, Opera, or any other browser. In other embodiments, the screens may not be associated with a web browser and may display information independent from such web browsers, such as an application, a widget, or some other means for displaying information outside of w web browser.

FIG. 6 illustrates a screen used by a schedule subscription system to display national logs obtained from various publishers. For example, publisher's pane 605 may show publishers and their Internet addresses (e.g., their IP addresses). In other embodiments, publisher's pane may include other contact information for publishers, such as an email address, telephone number, physical address, or other means for contacting or describing the location of one or more publisher. Log pane 607 may show national logs that are available from that publisher. The national logs can be downloaded from the publishers and stored in bulk by a schedule subscription system, or the schedule subscription system may store links, or pointers, to the available logs stored by the publisher, rather than storing the logs themselves. When storing only the links, the various edit locks, subscription and subscriber information, and the like can be stored in conjunction with the links. In some embodiments, log pane 607 may display links or pointers to the available logs stored by the publisher, edit locks, subscription and subscriber information, and/or any other information related to the available logs from the associated publisher.

Figure 7:
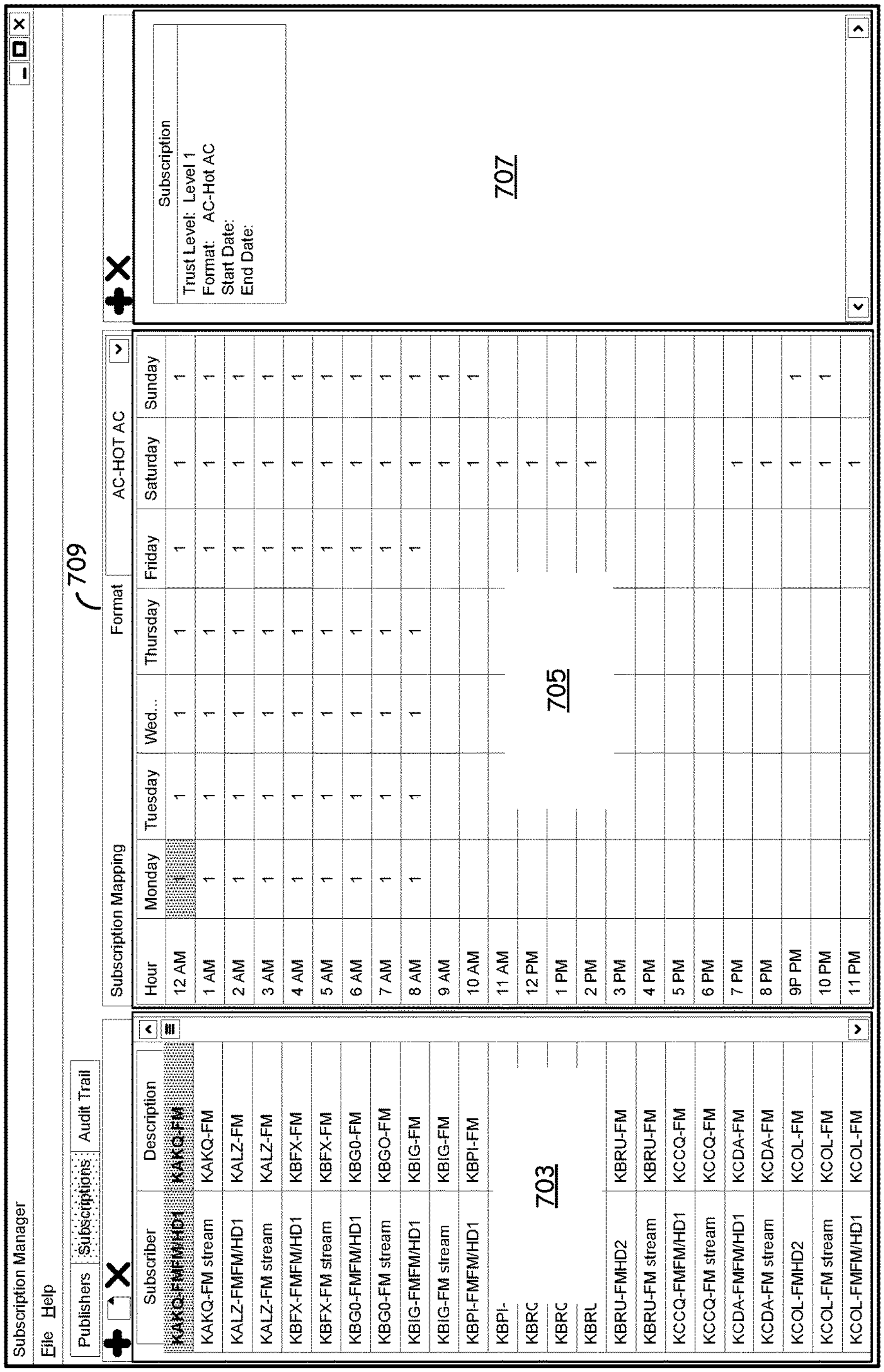

FIG. 7 illustrates a subscription screen used to define national log subscriptions for individual local subscribers and stations. A list of local subscribers and stations can be presented in subscriber pane 703, and subscription mapping pane 705 can display which hours of each day are covered by subscriptions to a particular national log corresponding to the subscriber selected in subscriber pane 703. The subscriptions mapped in subscription mapping pane 705 can be determined by the format selected in format selection area 709, which in this case is AC-HOT AC.

Description pane 707 displays a description of the national log associated with the selected hour, which is highlighted in FIG. 7, in subscription mapping pane 705. In the illustrated embodiment, any given day and hour for an individual subscriber can hold a subscription, which specifies that a national log of a given format should be delivered to that subscriber for broadcast on that hour of that day. The same or different subscription can be applied to multiple hours throughout the week. Thus, a subscription is not an array of days and hours, but rather an attribute of a single hour and day. Also any day and hour can contain more than one subscription. The description can include a trust level, the selected format, and a start and end date associated with the subscription.

In some embodiments, subscriptions are configured to have a time increment other than 1 hour. For example, a single subscription can cover an entire daypart, multiple hour increments, fractions of hours, or even a daily or weekly subscription. In some such embodiments, subscriptions having different time increments can be used together to form, for example, a subscription block of 1.5 hours. In another example a subscription having a time increment of 1.5 hours can be used in conjunction with a subscription having a time increment of 30 minutes, thereby allowing a local log of 2 hours to be generated.

The trust level shown in description pane 707 can, in some embodiments, be assigned by a national log provider, and used to control how the national logs are permitted to be edited by the subscriber. In at least one embodiment, no Trust is the lowest level, and when applied to a subscription the national logs will not be editable by the subscriber. Trust Level 1 can be used to indicate the lowest degree of trust while Trust Level 9 can be used to indicate the highest. Trust Level 2 through Trust Level 8 fall in between, and each higher number indicates a greater level of trust than each lower number. Note that other trust levels can be used, including non-numeric trust levels, and trust level schemas in which Trust Level 1 is the highest, and Trust Level 10 is the lowest.

In some embodiments, the trust level can be associated with the lock level. For example, the trust level for a subscription can work in tandem with a lock level, which may be specified for each clock position in a national log. When a clock is used to schedule, each Lock Level in the clock may be inherited by the corresponding position in the schedule. In this example, the lock level of a clock or schedule position can be set to Locked, which means it may not be edited by any Subscriber, or it can be set to a value between 1 and 9. In other embodiments, the same lock level may associated with several trust levels, or vice versa.

Figure 8:
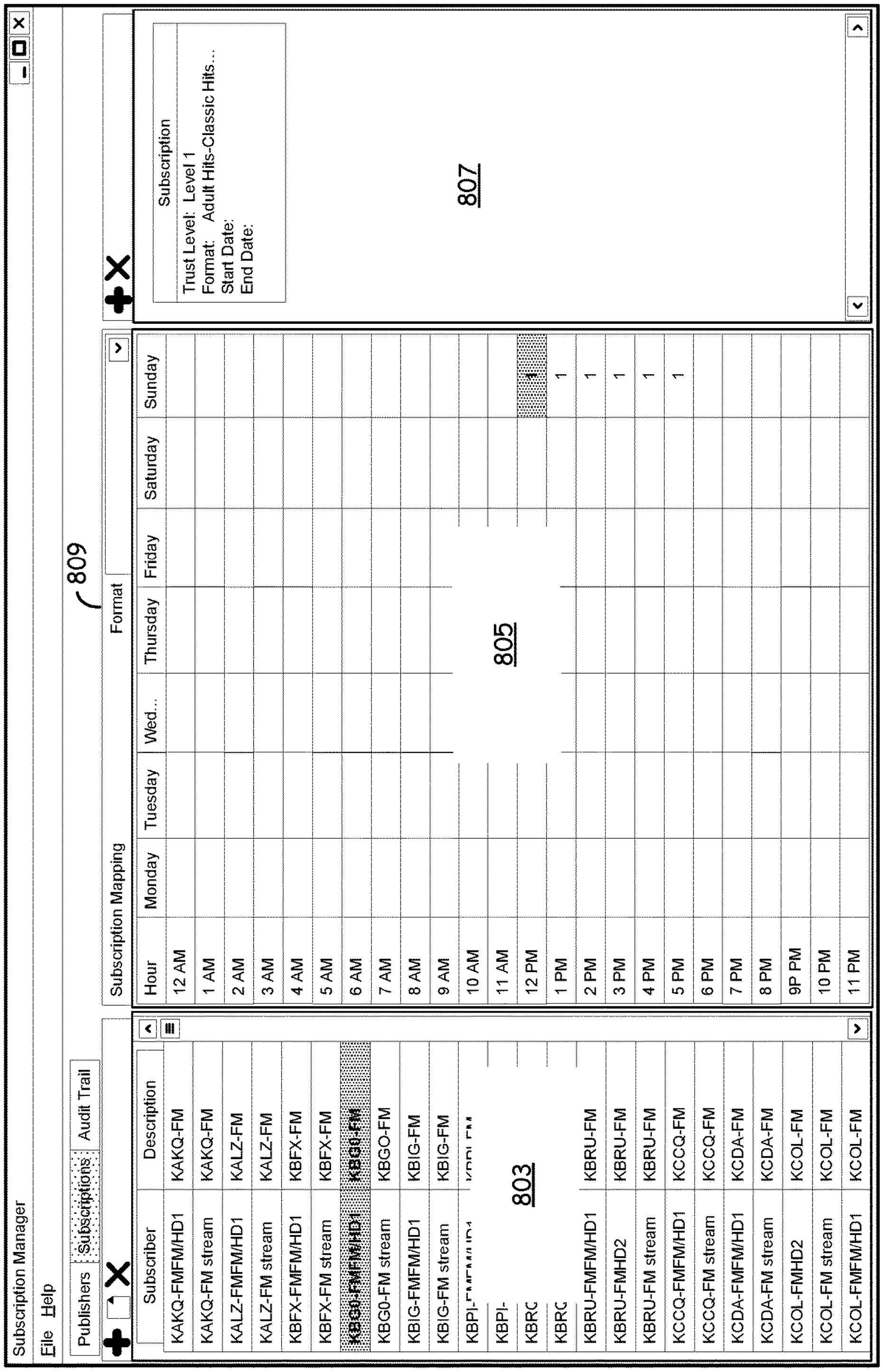

FIG. 8 shows an example of the subscription screen illustrated in FIG. 7. Subscriber KBGO-FMFM/HD1 is selected in subscriber pane 803. Because the format selection 809 indicates unselected, subscriptions for this particular subscriber are mapped, for all formats. In other embodiments, however, format selection 809 may allow the user to select all subscriptions for the selected subscriber. Subscription mapping pane 805 shows a 1 in the 12 PM through 5 PM hours of Sunday. The 1 can indicate that each day and hour has one subscription. The subscription information shown in description pane 807 corresponds to the selected cell or cells in subscription mapping pane 805. In this example, the subscription details for only the 12 PM hour are displayed in description pane 807, since that is the selected cell.

Figure 9:
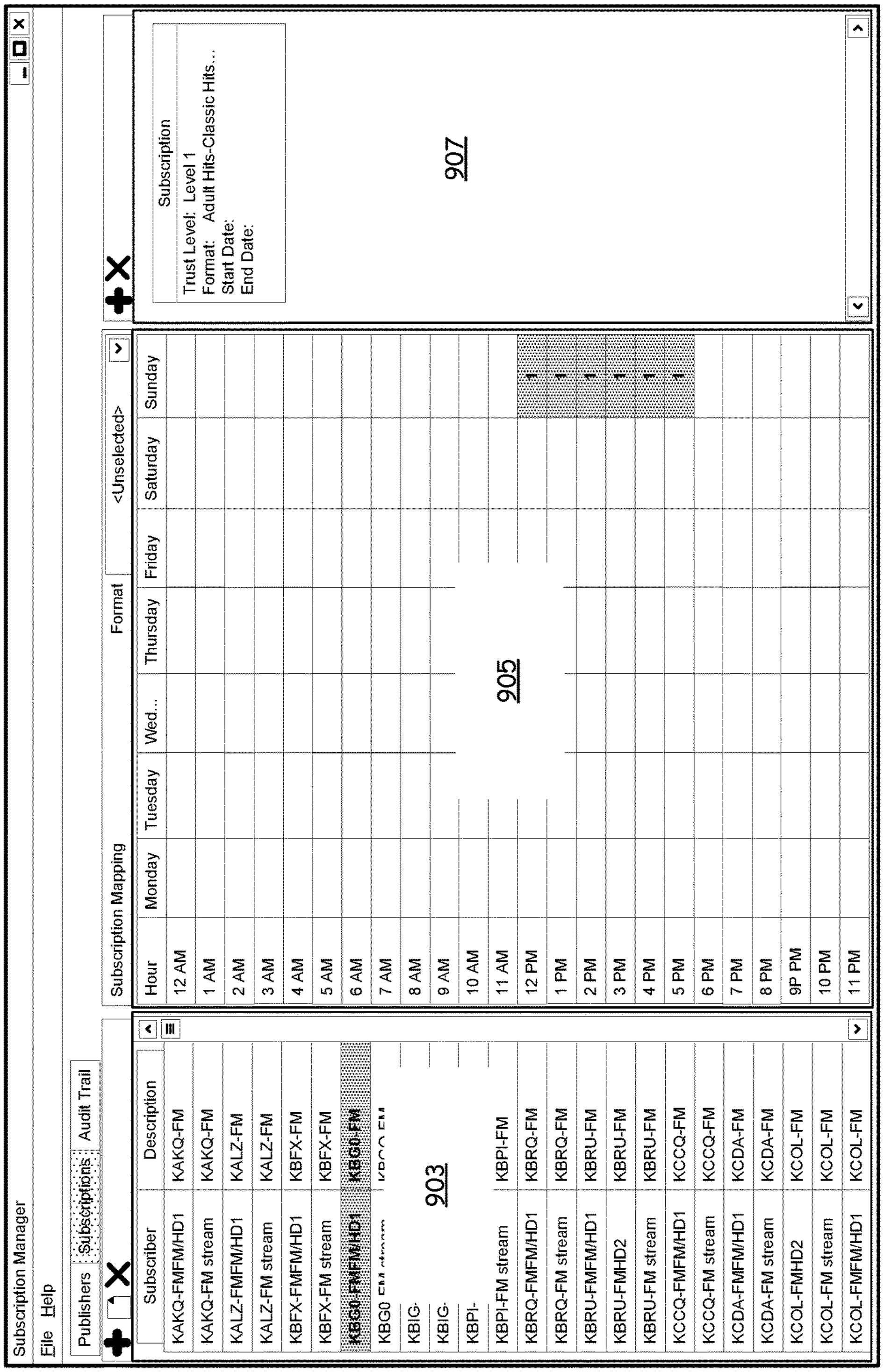

FIG. 9 shows an example of the subscription screen illustrated in FIG. 8, except that each hour for which the subscriber, highlighted in subscriber pane 903, has a subscription is highlighted in subscription mapping pane 905. Description pane 907 shows a single entry, which indicates that each selected hour has an identically defined subscription. Note that this example shows six identical subscriptions, so there is only one subscription description to be displayed in description pane 907.

In at least one embodiment, when there is a multiple selection of days and hours, the right pane shows only those subscriptions that are common to the selected days and hours. Thus, if any of the six selected elements in subscription mapping pane 905 is different from any of the others, description pane 907 may be blank. In some embodiments, other presentation formats can be used. For example, in some embodiments, description pane 907 may display all of the subscriptions that are highlighted in the mapping pane 905. In such an embodiment, the description pane 907 may group the description of the subscriptions in accordance with common trust levels, formats or some other common parameter.

Figure 10:
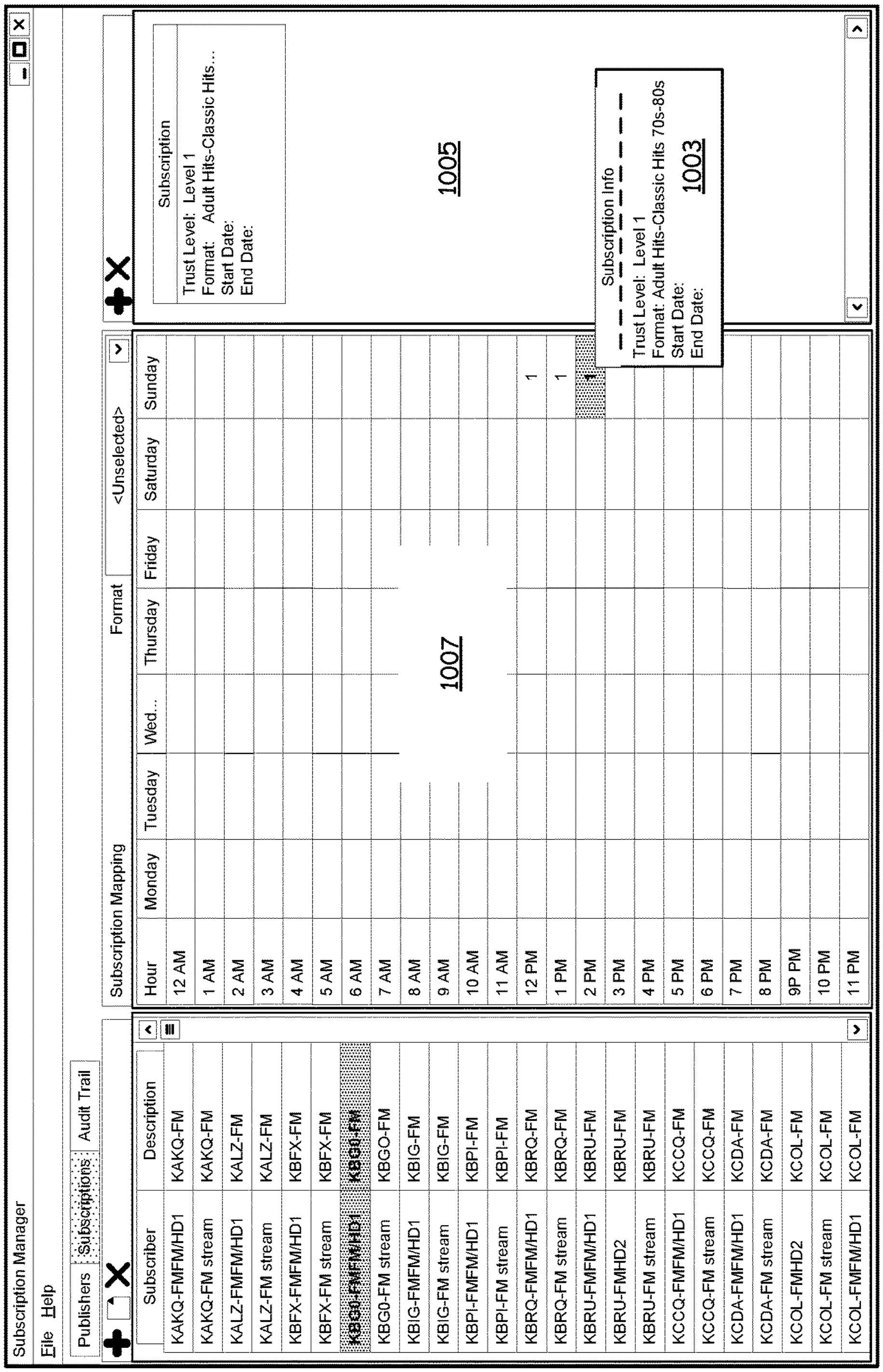

In some embodiments, supplemental information may be displayed to further describe any of the displayed components. FIG. 10 shows an example of fly-out text 1003 that can be displayed when a cursor hovers over a particular item. Note that in at least one embodiment, even if description pane 1005 is blank because the selected items in subscription mapping pane 1007 are not identical subscriptions, fly-out text 1003 can be used to display information about any one particular item in subscription mapping pane 1007, or any other pane. In other embodiments, fly-out text 1003 may be activated by pressing a certain key, or combination of keys, on the keyboard or mouse when a component is highlighted.

Figure 11:
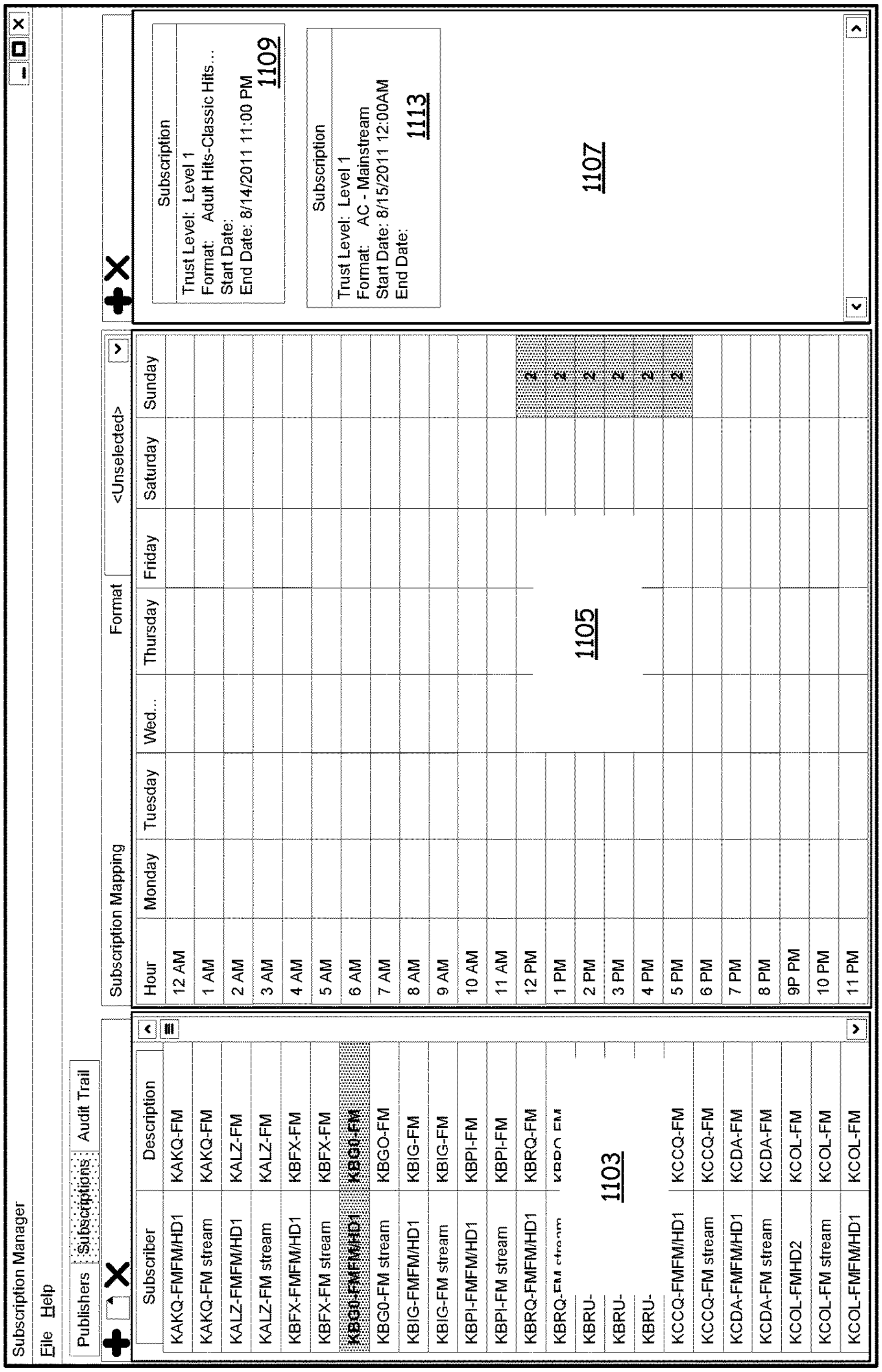

FIG. 11 illustrates a subscription screen in which a subscriber selected in subscriber pane 1103 has two identical subscriptions in each of Sunday hours from 12:00 PM to 5:00 PM. The six hour/day combinations highlighted in subscription mapping pane 1105 show the number 2, which indicates that there are two subscriptions for each highlighted day/hour combination. Note that two subscription descriptions are displayed in description pane 1107.

Description 1109 shows Adult Hits—Classic Hits as the Format, and displays an End Date of Aug. 14, 2011 at 11:00 PM. Description 1113 shows AC—Mainstream as the Format, with a Start Date of Aug. 15, 2011 at 12:00 AM. In this example the format of the selected days and hours on the subscribing station will change as of Midnight on August 15. In some embodiments, any day and hour can have multiple subscriptions provided there is no date/time overlap among them. In at least one embodiment, conflicts are automatically detected, and the user is alerted to the conflict. In some embodiments, the user will be prevented from creating conflicting subscriptions.

In some embodiments additional types of conflicts can be detected or prevented. For example, if a national log includes a parameter that prohibits placement adjacent to another national log, whether for reasons relating to media royalties or programming constraints imposed by a subscriber, publisher, or simply based on current best practices, a subscription system can prevent generation of a subscription or placement of the subscription adjacent to the prohibited log.

Figure 12:
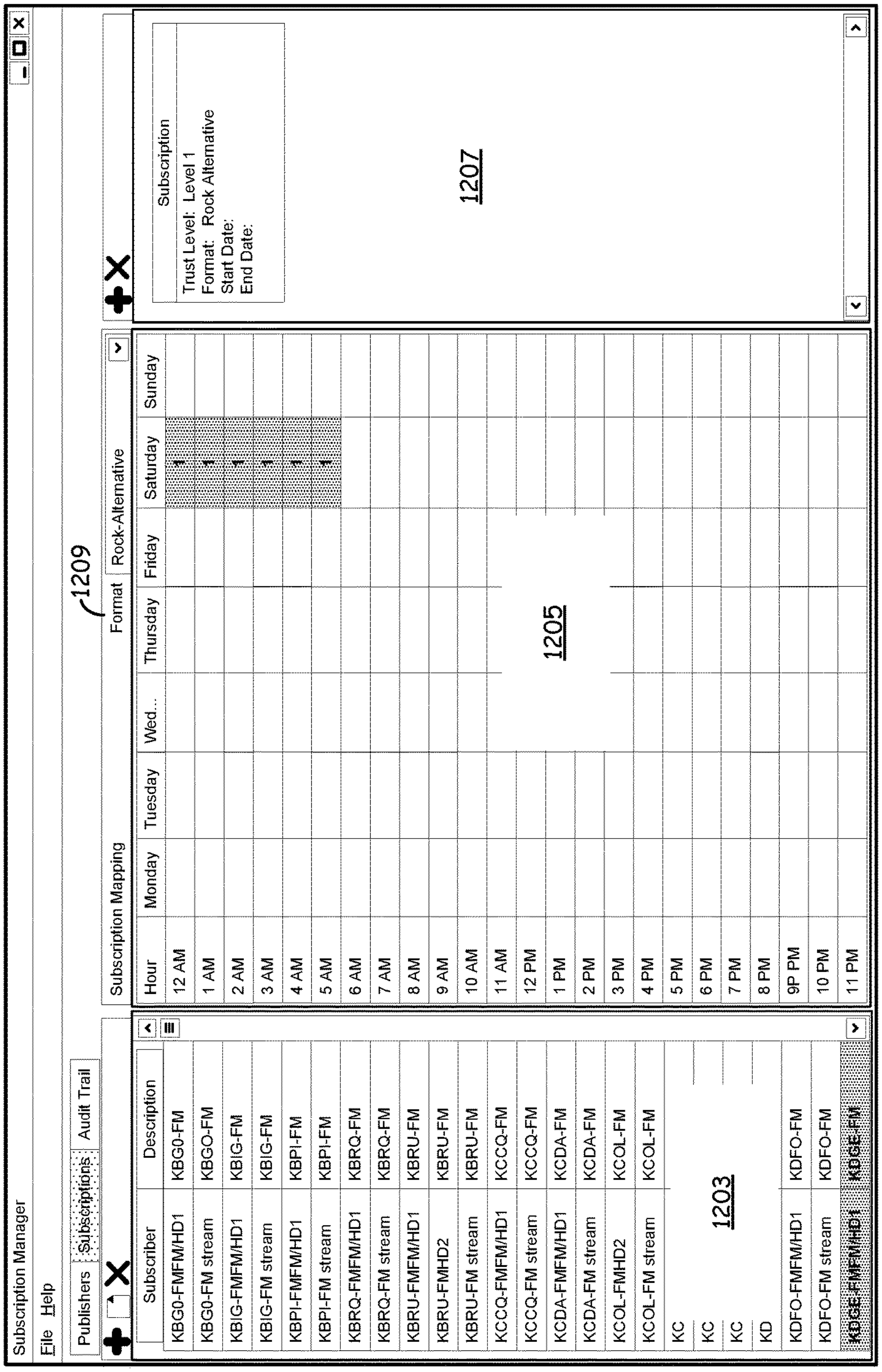
Figure 13:
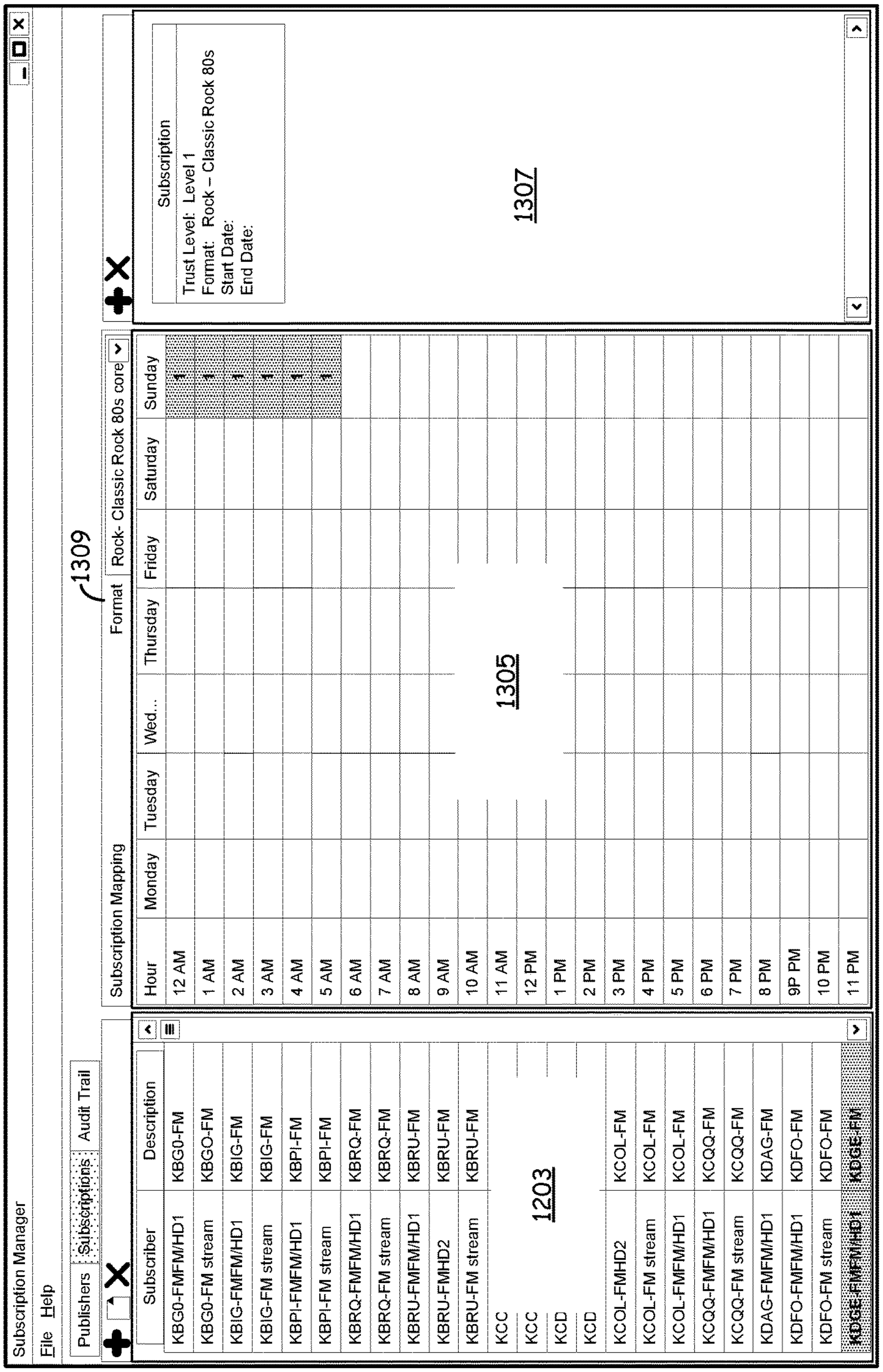

FIGS. 12 and 13 illustrate how selection of different formats can affect the information displayed in a subscription manager screen. In FIG. 12, for example, format selection 1209 indicates Rock-Alternative, and subscriptions shown in subscriber mapping pane 1205 for the selected subscriber in subscriber pane 1203 indicates six Rock-Alternative subscriptions on Saturday, from 12 AM to 5 AM. The description of the Rock-Alternative subscription is shown in description pane 1207. In FIG. 13, format selection 1309 is set to Rock-Classic Rock 80s, and subscription pane 1305 shows the subscription in six hour/day combinations on Sunday, from 12 AM to 6 AM, and description pane 1307 shows the description corresponding to the rock-Classic Rock 80s format. Note that the subscriptions referred to above are subscriptions to national logs for dayparts that include the highlighted hour/day combinations.

Referring next to FIG. 14, a scheduler window can be used in some embodiments to ensure that national logs are not downloaded to a subscriber before any necessary editing has taken place, and the logs have been approved. Note that the "Unscheduled" button has been selected, so that unscheduled time and date combinations can be easily identified. Blank fields indicate unscheduled dates and times; dates and times showing an "N" indicate that scheduling is in progress; and highlighted dates and times, indicate that corresponding logs have already been scheduled.

Note that in the illustrated embodiment, the dates from 12/5/11 through 12/11/11 are highlighted, indicating that scheduling of the National logs for those times and dates has been finalized, and the finalized logs are locked. In some embodiments, a National Log must be locked before being made available for distribution to local subscribers.

The "N" shown in the table for dates 12/12/11 through 12/18/11 indicate that logs for the corresponding dates and times are in the process of being scheduled, and may be completely scheduled but not finalized or locked. National logs for these dates may still be edited and will not be available for downloading to subscribers until their status changes to locked.

Referring next to FIG. 15, a lock options management screen is illustrated and discussed. The screen illustrated in FIG. 15 includes various user selectable objects that allow setting lock options, including name field 1501, Don't Copy Options field 1503, parent format selection menu 1505, and a number of radio buttons that allow setting Ignore, Copy, and Inherit attributes based on category group, daypart, packet, mood, energy, tempo opener, texture, or sound code.

Some formats are implemented using a parent feature, which allows creation of variants of a primary schedule. An example is the Classic Rock format, in which the main thrust of the music is 70s-based, but the variant format has more of an 80's flavor. The 70s-based format can be scheduled for a Parent station, while the 80's-flavored variant is managed in a child station of the 70's Parent.

In some embodiments, if the Don't Copy attribute is set on one or more clock positions, then later, during scheduling, the Don't Copy attribute is inherited by the associated position in the schedule, or log. In FIG. 15, several of the 70's positions in the clocks of the Parent station are set to Don't Copy. After scheduling in the Parent station, schedules are copied into the 80's Child station. The Don't Copy positions are skipped during the copy process, leaving unscheduled positions in the Child station. Scheduling then takes place in the Child, where the unscheduled positions are filled with 80's songs, thus creating an 80's-flavored variant of the original 70's schedule.

The Don't Copy positions for a national log used in the Parent station should be locked into place, and all clock positions except the Don't Copy positions in the Child station, should be locked into place and disabled for editing. The Don't Copy options can be set using Don't Copy Option field 1503, and the options can include, but are not limited to, the following: None, which is the option that should be selected for the parent station, so that clock positions in the national log will be copied to the parent station's clock (note that content of a clock position can also be locked in some embodiments); LockDontCopyPositions, which will allow changing the contents of the Don't Copy positions in the editor of the parent station, but will disallow any editing action that will change the location of the position; and LockAllExceptDontCopyPositions, which will disallow changing the contents or location of all positions except the Don't Copy positions in the editor of the child station.

FIG. 16 illustrates a screen used to assign lock levels to the elements of a national log. Note that the item in clock positions 6 and 11 are marked with the Don't Copy attribute, as discussed above. Some positions, for example positions 1, 3, 4, 5, 6, and numerous others are completely locked for editing. Other positions, for example positions 2 and 20 are only partially locked for editing by assigning them lock level 2. Lock level 2 can correspond directly to a trust level of a subscriber, station, or system, such that a trust level of 2 equals a lock level of 2. In other embodiments, lock level 2 may be more complex, indicating that a subscriber with a trust level in a specified range is permitted to perform a specified level of editing of the clock position, using a specified range of replacement items. Thus, for example, lock level 2 may allow any subscriber with a trust level of 1-4 to edit the contents of the clock position by replacing the contents with an item selected from one of two different format categories. Other lock levels can likewise be used to set desired editing restrictions.

Referring next to FIG. 17, a scheduling window displaying local clock information is illustrated and discussed according to various embodiments of the disclosure. In some embodiments, the window is divided into three panes: clock list pane 1703; plot pane 1705; and local clock pane 1707. Clock list pane 1703 can display a list of clocks into which the national logs are to be inserted. When the "plus" sign to the left of a listed clock is selected, an expanded list of dates and hours in which the clock has been scheduled can be displayed, as illustrated in FIG. 18.

Referring again to FIG. 17, plot pane 1705 can show, depending on which options are selected, a plot representing a date and hour plot of the clock currently selected in clock list pane 1703, a date and hour plot of all clocks used throughout the date range, or another type of graph representing information associated with national logs/clocks used to generate local logs/clocks.

Referring briefly to FIG. 19, an example of another type of graph that can be displayed in plot pane 1705 is illustrated. FIG. 19 displays a graphical representation of the clock selected in clock list pane 1703. In some embodiments, the positions for which local editing is permitted are shown as "exploded" slices 1905 in the pie chart. All other positions can be represented as graphic slices with widths proportionally adjusted to match the average runtime of each associated clock position.

Referring again to FIG. 17, local clock pane 1707 displays a local clock with national log entries corresponding to the national log/clock selected in clock list pane 1703 already incorporated. Most of the positions in local clock pane 1707 are locked, as indicated by the lock icons to the left of each clock position. The locked positions are inert, meaning they may not be deleted, moved or modified in any way. In at least some embodiments, insertion of an extra position into the clock is prohibited. Other positions, namely the fourth from the top and the second from the bottom in our example, are lighter in color. These may be edited. Other lock indications, for example coloring of locked or unlocked positions, can be used in place of or in addition to the lock icons to indicate locked or unlocked positions.

Some embodiments require selecting a local category group for each of the editable positions. Media items from the category group selected can be displayed when replacing an editable position in a national log. In some instances other category groups can be selected for replacement suggestions. The category group chosen here can be designated as the default when filling unscheduled, editable positions in other national logs. In addition to selecting the category group of media items, the following can also be changed for each editable position: Chain; Goal; Constraint; Droppable; and Info.

In some embodiments, each time the scheduling window is accessed, national clock/log information is pulled from a subscription schedule system to ensure the local scheduling system is using the very latest clocks/logs. In some embodiments, a Refresh Clocks button is provided on the toolbar.

Some or all of the methods and processes described herein can be embodied in or performed by one or more processing systems. An example of such a processing system is discussed with reference to FIG. 20. Processing system 2000 includes one or more central processing units, such as CPU A 2005 and CPU B 2007, which may be conventional microprocessors interconnected with various other units via at least one system bus 2010. CPU A 2005 and CPU B 2007 may be separate cores of an individual, multi-core processor, or individual processors connected via a specialized bus 2011. In some embodiments, CPU A 2005 or CPU B 2007 may be a specialized processor, such as a graphics processor, other co-processor, or the like.

Processing system 2000 includes random access memory (RAM) 2020; read-only memory (ROM) 2015, wherein the ROM 2015 could also be erasable programmable read-only memory (EPROM) or electrically erasable programmable read-only memory (EEPROM); and input/output (I/O) adapter 2025, for connecting peripheral devices such as disk units 2030, optical drive 2036, or tape drive 2037 to system bus 2010; a user interface adapter 2040 for connecting keyboard 2045, mouse 2050, speaker 2055, microphone 2060, or other user interface devices to system bus 2010; communications adapter 2065 for connecting processing system 2000 to an information network such as the Internet or any of various local area networks, wide area networks, telephone networks, or the like; and display adapter 2070 for connecting system bus 2010 to a display device such as monitor 2075. Mouse 2050 has a series of buttons 2080, 2085 and may be used to control a cursor shown on monitor 2075. Monitor 2075 can be used to display a graphical user interface (GUI), implemented by a program of instructions executed by either or both of CPU A 2005 and CPU B 2007.

It will be understood that processing system 2000 may include other suitable data processing systems without departing from the scope of the present disclosure. For example, processing system 2000 may include bulk storage and cache memories, which provide temporary storage of at least some program code in order to reduce the number of times code must be retrieved from bulk storage during execution.

Various disclosed embodiments can be implemented in hardware, software, or a combination containing both hardware and software elements. In one or more embodiments, the invention is implemented in software, which includes but is not limited to firmware, resident software, microcode, etc. Some embodiments may be realized as a computer program product, and may be implemented as a computer-usable or computer-readable medium tangibly embodying program code for use by, or in connection with, a computer, a processor, or other suitable instruction execution system.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The enclosed embodiments has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The enclosed embodiments may have also been described, at least in part, in terms of one or more embodiments. One or more embodiments may be used herein to illustrate an aspect thereof, a feature thereof, a concept thereof, and/or an example thereof. A physical embodiment of an apparatus, an article of manufacture, a machine, and/or of a process that embodies the description herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments herein. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various functions and features of the enclosed embodiments have been expressly described herein, other combinations of these features and functions are likewise possible. The present invention is not limited by the particular examples disclosed herein and expressly incorporates these other combinations.

What is claimed is:

1. A method for use in a media scheduling system including a scheduling service and a plurality of subscribing stations, the method comprising:

obtaining, at the scheduling service, a previously-generated log of media items configured to be consumed by a plurality of subscribing stations assigned varying levels of access rights in the previously-generated log of media items;

receiving from a first requesting station, at the scheduling service, a first request for the previously-generated log of media items;

in response to receiving the first request for the previously-generated log of media items:

obtaining, at the media scheduling system, first subscription information associated with the first requesting station, the first subscription information indicating access rights of the first requesting station;

altering, based on the access rights of the first requesting station, the previously-generated log of media items to generate a first restricted log of media items;

transmitting the first restricted log of media items to the first requesting station;

receiving from a second requesting station, at the scheduling service, a second request for the previously-generated log of media items;

in response to receiving the second request for the previously-generated log of media items:

obtaining, at the media scheduling system, second subscription information associated with the second requesting station, the second subscription information indicating access rights of the second requesting station;

altering, based on the access rights of the second requesting station, the previously-generated log of media items to generate a second restricted log of media items, different from the first restricted log of media items; and transmitting the second restricted log of media items to the second requesting station.

2. The method of claim 1, wherein access rights of at least one of the first requesting station and the second requesting station include editing permissions for particular clock positions within the previously-generated log of media items.

3. The method of claim 1, wherein access rights of at least one of the first requesting station and the second requesting station include editing permissions associated with media items included in a particular database.

4. The method of claim 1, wherein access rights of at least one of the first requesting station and the second requesting station include editing permissions specifying a pool of permissible replacement media items.

5. The method of claim 1, further comprising:

setting particular access rights in response to receiving, from a particular requesting station, an initial request for a particular log of media items; and re-using the particular access rights for subsequent requests for the particular log of media items by the particular requesting station.

6. The method of claim 1, wherein access rights of a requesting station are determined, at least in part, based on a security level associated with scheduling software used by the requesting station.

7. The method of claim 1, wherein access rights of at least one of the first requesting station and the second requesting station are limited based on a subscription category.

8. A non-transitory computer readable medium tangibly embodying a program of instructions configured to be executed by a processor implementing a scheduling service, the program of instructions comprising:

at least one instruction to obtain a previously-generated log of media items configured to be consumed by a plurality of subscribing stations assigned varying levels of access rights in the previously-generated log of media items;

at least one instruction to receive, from a first requesting station, a first request for the previously-generated log of media items;

at least one instruction to obtain, in response to receiving the first request for the previously-generated log of media items, first subscription information associated with the first requesting station, the first subscription information indicating access rights of the first requesting station;

at least one instruction to alter, based on the access rights of the first requesting station, the previously-generated log of media items to generate a first restricted log of media items;

at least one instruction to transmit the first restricted log of media items to the first requesting station;

at least one instruction to receive, from a second requesting station, a second request for the previously-generated log of media items;

at least one instruction to obtain, in response to receiving the second request for the previously-generated log of media items, second subscription information associated with the second requesting station, the second subscription information indicating access rights of the second requesting station;

at least one instruction to alter, based on the access rights of the second requesting station, the previously-generated log of media items to generate a second restricted log of media items, different from the first restricted log of media items; and at least one instruction to transmit the second restricted log of media items to the second requesting station.

9. The non-transitory computer readable medium of claim 8, wherein access rights of at least one of the first requesting station and the second requesting station include editing permissions for particular clock positions within the previously-generated log of media items.

10. The non-transitory computer readable medium of claim 8, wherein access rights of at least one of the first requesting station and the second requesting station include editing permissions associated with media items included in a particular database.

11. The non-transitory computer readable medium of claim 8, wherein access rights of at least one of the first requesting station and the second requesting station include editing permissions specifying a pool of permissible replacement media items.

12. The non-transitory computer readable medium of claim 8, the program of instructions further comprising:

at least on instruction to set particular access rights in response to receiving, from a particular requesting station, an initial request for a particular log of media items; and at least on instruction to re-use the particular access rights for subsequent requests for the particular log of media items by the particular requesting station.

13. The non-transitory computer readable medium of claim 8, wherein access rights of a requesting station are determined, at least in part, based on a security level associated with scheduling software used by the requesting station.

14. The non-transitory computer readable medium of claim 8, wherein access rights of at least one of the first requesting station and the second requesting station are limited based on a subscription category.

15. A schedule subscription server comprising:

processing circuitry;

memory coupled to the processing circuitry;

a communications interface coupled to the processing circuitry and the memory;

the processing circuitry configured to obtain a previously-generated log of media items configured to be consumed by a plurality of subscribing stations assigned varying levels of access rights in the previously-generated log of media items;

the communications interface configured to receive, from a first requesting station, a first request for the previously-generated log of media items;

the processing circuitry further configured to:

obtain, in response to receiving the first request for the previously-generated log of media items, first subscription information associated with the first requesting station, the first subscription information indicating access rights of the first requesting station;

conditionally alter, based on the access rights of the first requesting station, the previously-generated log of media items to generate a first restricted log of media items;

conditionally transmit the first restricted log of media items to the first requesting station;

the communications interface further configured to receive, from a second requesting station, a second request for the previously-generated log of media items;

the processing circuitry further configured to:

in response to receiving the second request for the previously-generated log of media items, second subscription information associated with the second requesting station, the second subscription information indicating access rights of the second requesting station;

conditionally alter, based on the access rights of the second requesting station, the previously-generated log of media items to generate a second restricted log of media items, different from the first restricted log of media items; and conditionally transmit the second restricted log of media items to the second requesting station.

16. The schedule subscription server of claim 15, wherein access rights of at least one of the first requesting station and the second requesting station include editing permissions for particular clock positions within the previously-generated log of media items.

17. The schedule subscription server of claim 15, wherein access rights of at least one of the first requesting station and the second requesting station include editing permissions associated with media items included in a particular database.

18. The schedule subscription server of claim 15, wherein access rights of at least one of the first requesting station and the second requesting station include editing permissions specifying a pool of permissible replacement media items.

19. The schedule subscription server of claim 15, the processing circuitry further configured to:

set particular access rights in response to receiving, from a particular requesting station, an initial request for a particular log of media items; and re-use the particular access rights for subsequent requests for the particular log of media items by the particular requesting station.

20. The schedule subscription server of claim 15, wherein access rights of a requesting station are determined, at least in part, based on a security level associated with scheduling software used by the requesting station.

* * * * *